United States Patent [19]

Fischer et al.

[11] Patent Number: 5,019,788
[45] Date of Patent: May 28, 1991

[54] AMPLIFIER WITH WIDE DYNAMIC RANGE

[75] Inventors: Michael C. Fischer, Palo Alto; William E. Strasser, Montara, both of Calif.

[73] Assignee: Hewlett-Packard Company, Palo Alto, Calif.

[21] Appl. No.: 395,114

[22] Filed: Aug. 16, 1989

[51] Int. Cl.$^5$ .............................. H03F 3/68
[52] U.S. Cl. ............................ 330/9; 330/84; 330/126; 330/295
[58] Field of Search ............... 330/9, 10, 84, 126, 330/295

[56] References Cited

U.S. PATENT DOCUMENTS

| | | | |
|---|---|---|---|
| 2,760,011 | 8/1956 | Berry | 330/126 |
| 4,091,414 | 5/1978 | Chow | 358/174 |
| 4,227,256 | 10/1980 | O'Keefe | 455/251 |
| 4,281,295 | 7/1981 | Nishimura et al. | 333/14 |
| 4,636,743 | 1/1987 | Cotreau | 330/295 |
| 4,636,744 | 1/1987 | King et al. | 330/295 |
| 4,775,237 | 10/1988 | Cioppi | 356/417 |
| 4,837,832 | 6/1989 | Fanshel | 381/68.4 |

OTHER PUBLICATIONS

Teledyne Semiconductor Data Book (no date available), pp. 13-37 to 13-44.
Intersil Component Data Catalog (1986), pp. 4-50 to 4-64.

Primary Examiner—James B. Mullins

[57] ABSTRACT

Method and apparatus for amplification of an electrical signal whose frequency may range from zero to 300 MHz, and whose voltage level may range from 0.5 volt to 0.5 volt, with intermittent resetting of the zero voltage level provided for. One or two incoming signals are divided into low frequency and high frequency components, and amplification of each of these components is optimized by passage of the component through a separate amplification circuit. Input signals to the high and low frequency amplification circuits are intermittently chopped to allow resetting of the zero voltage levels of the amplifier.

52 Claims, 18 Drawing Sheets

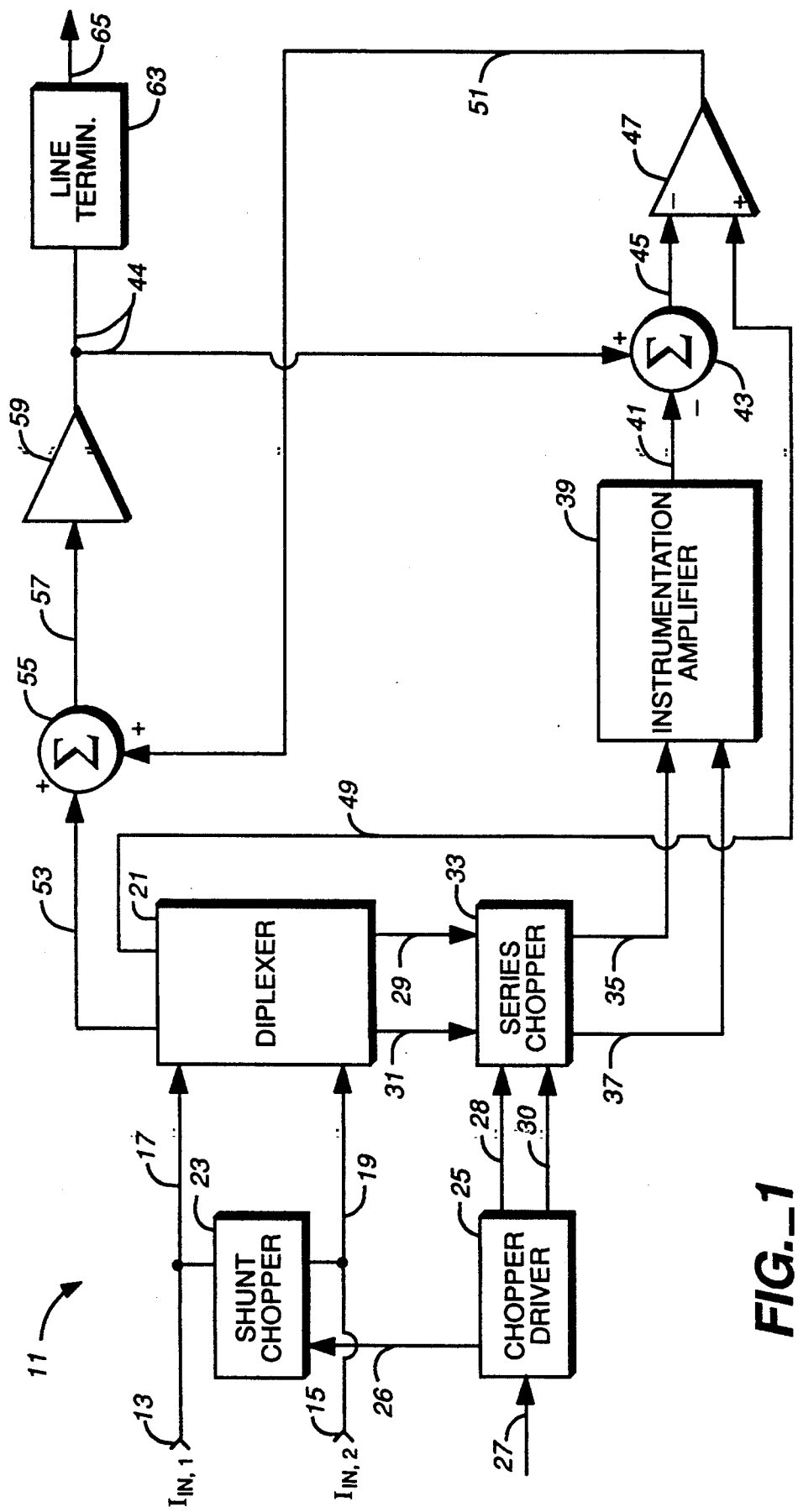
FIG._1

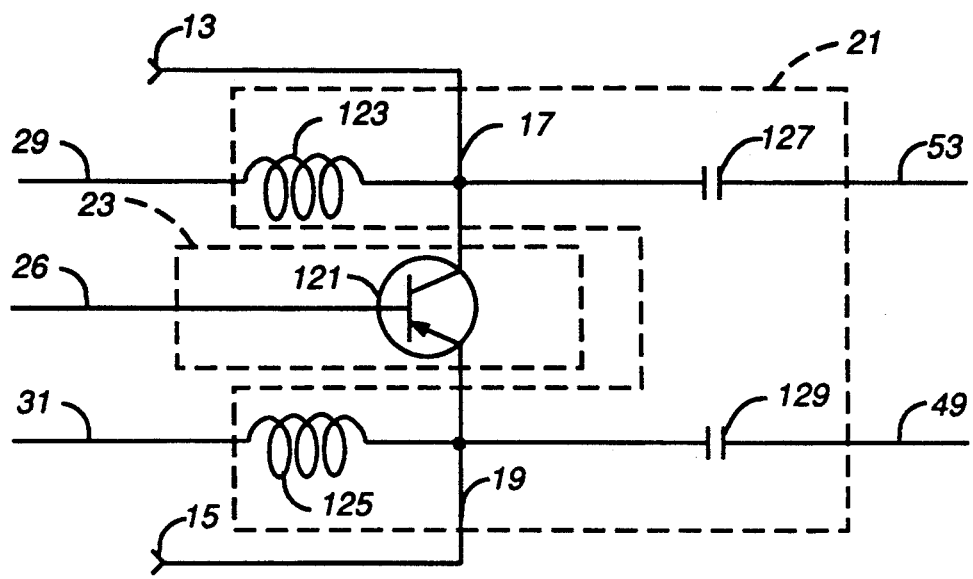
FIG._2
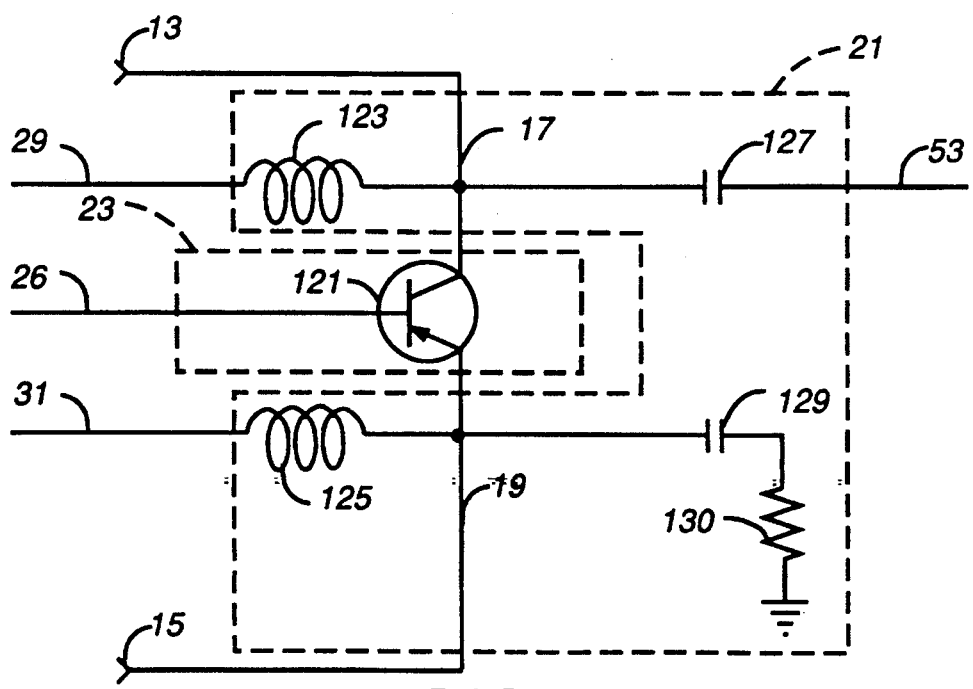
FIG._2A

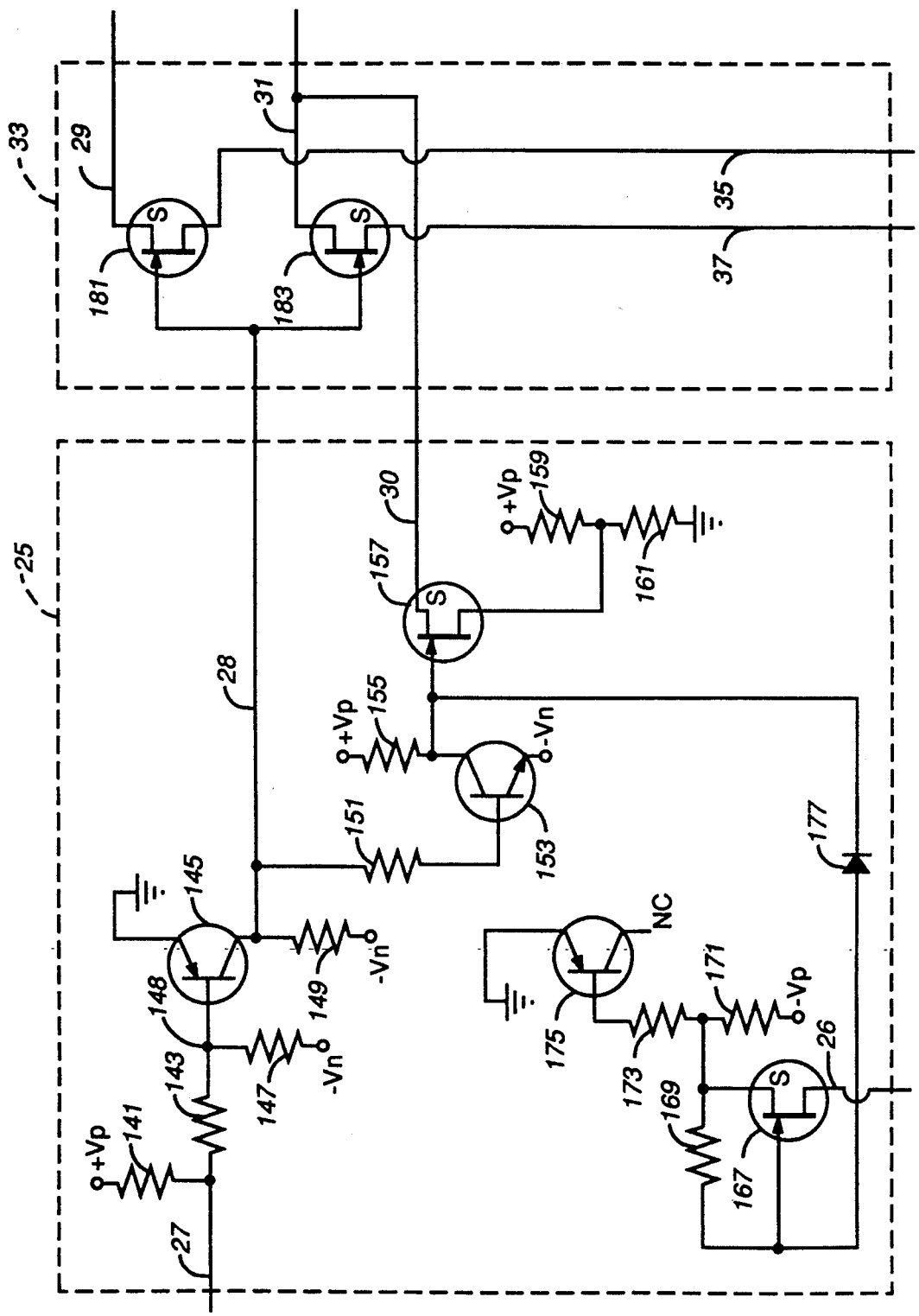
FIG._3

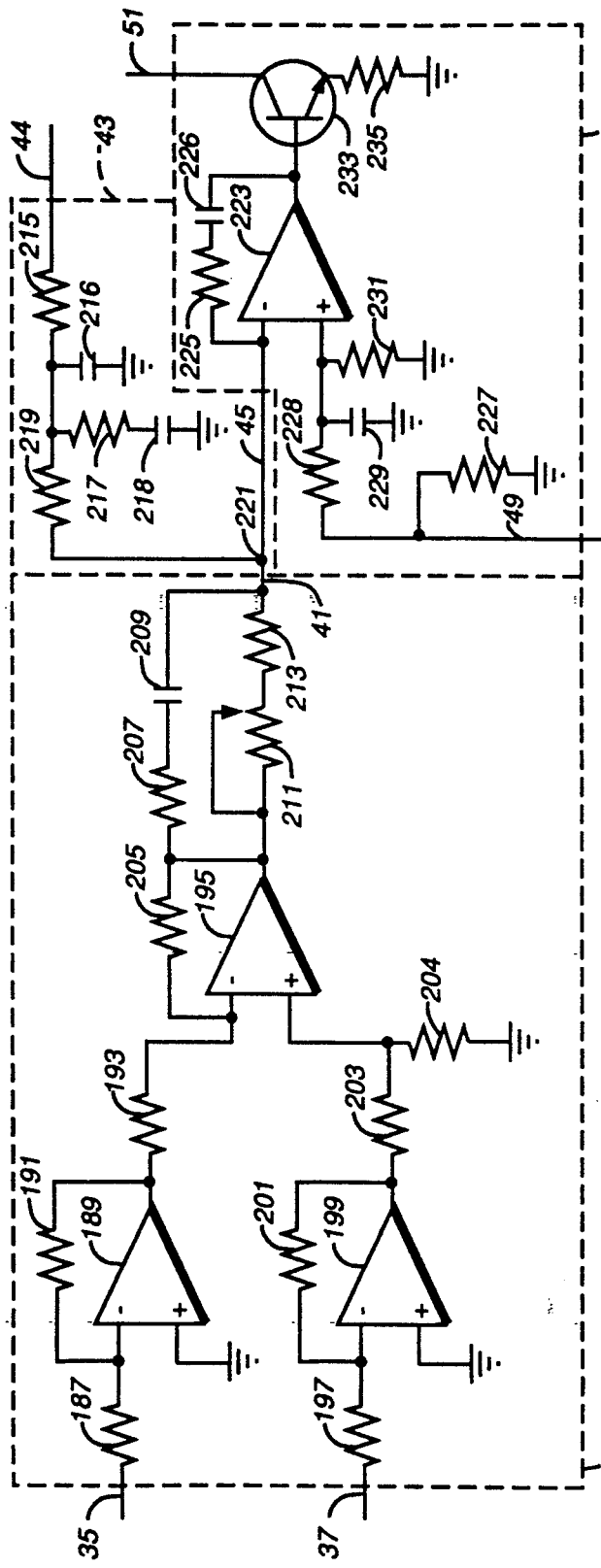
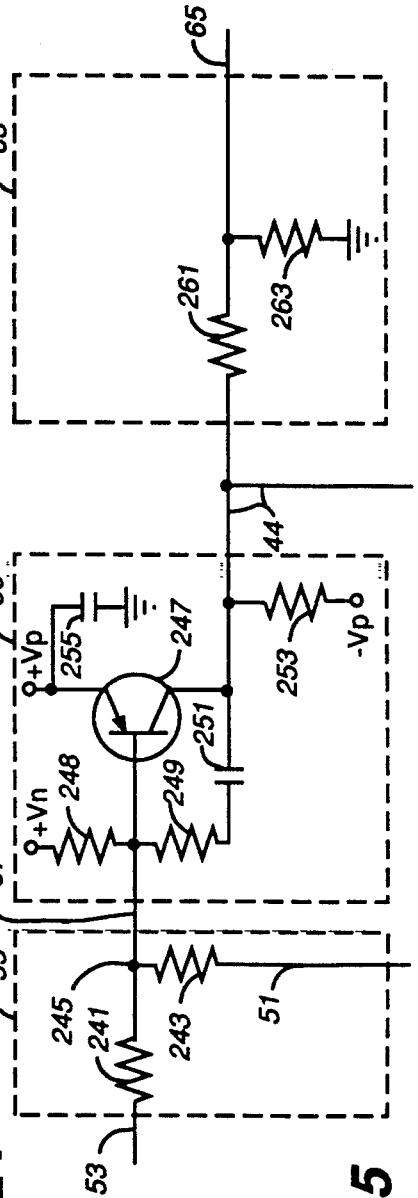
FIG._4
FIG._5

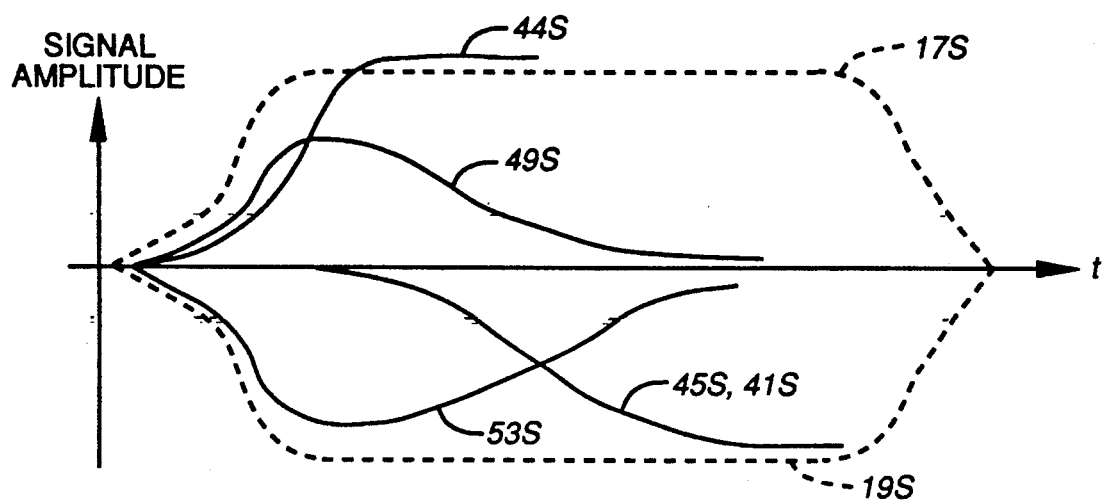
FIG._6
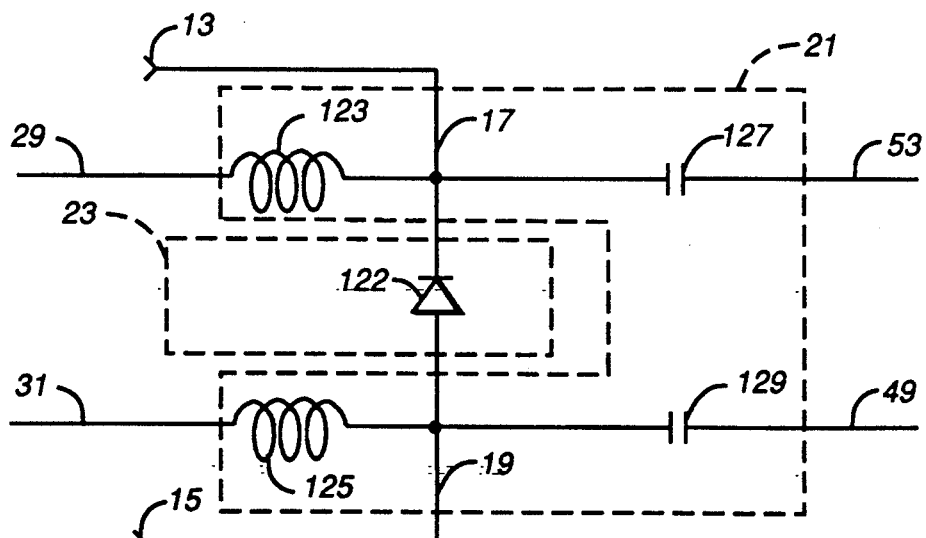
FIG._7

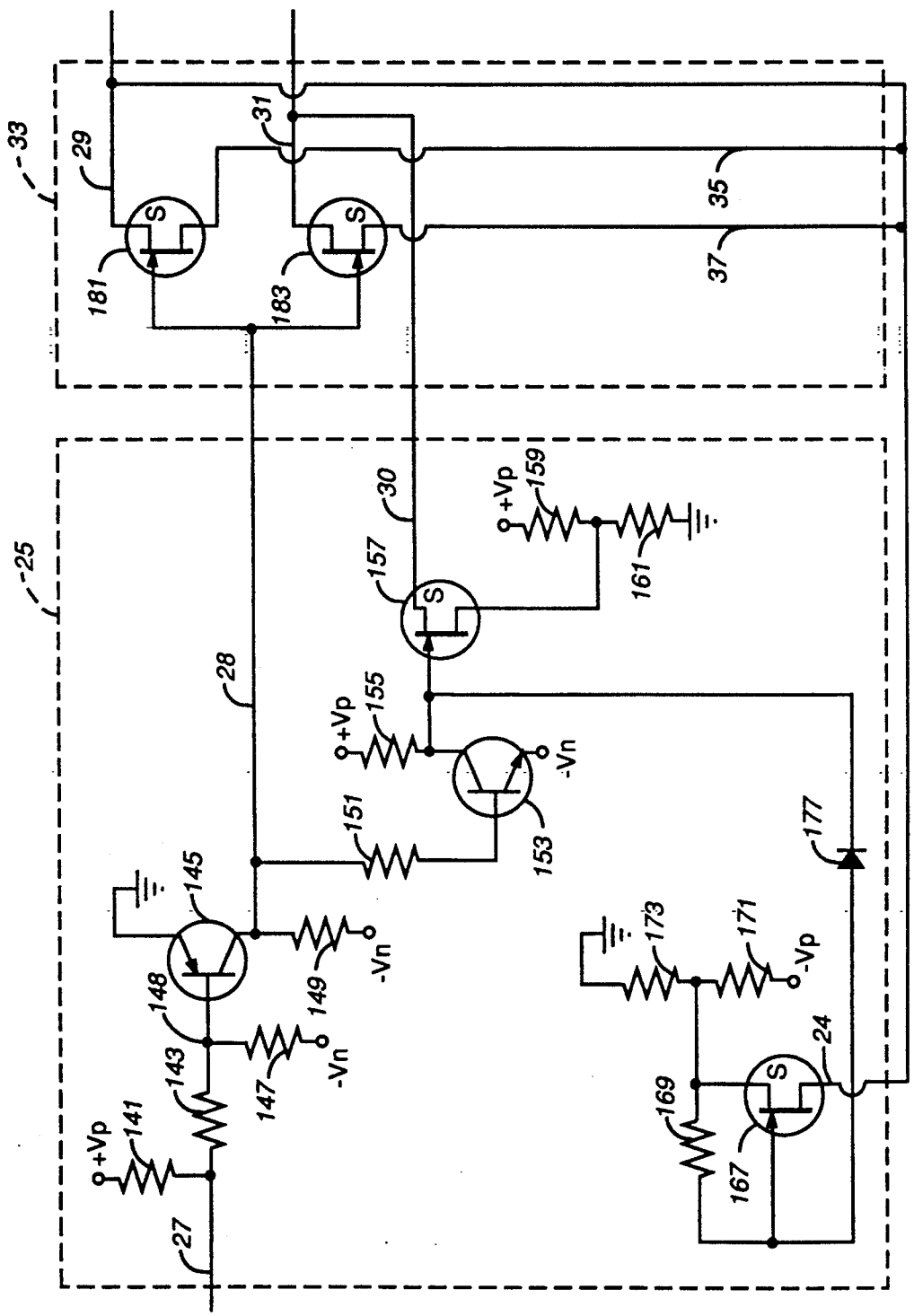
FIG._8

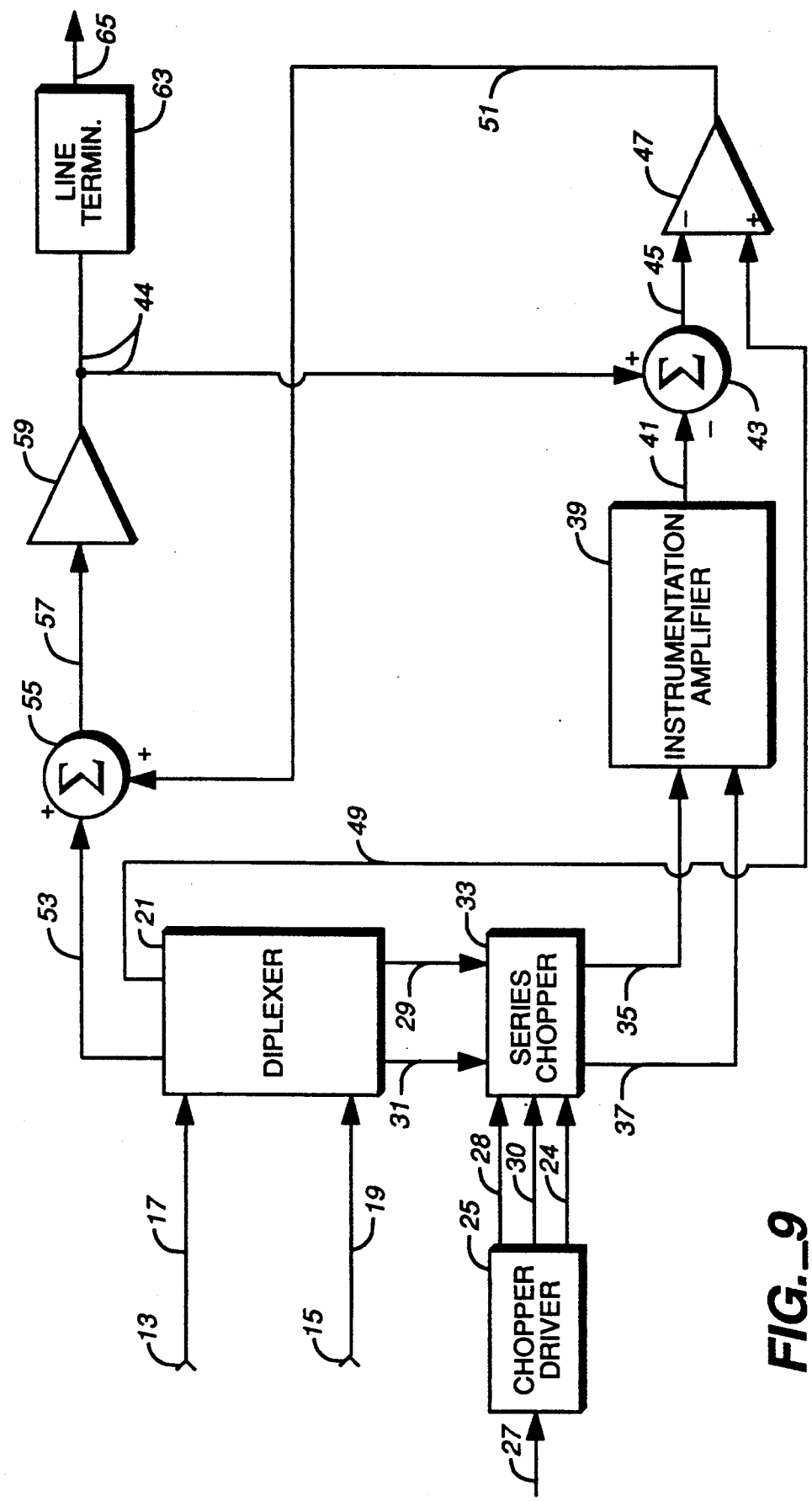
FIG._9

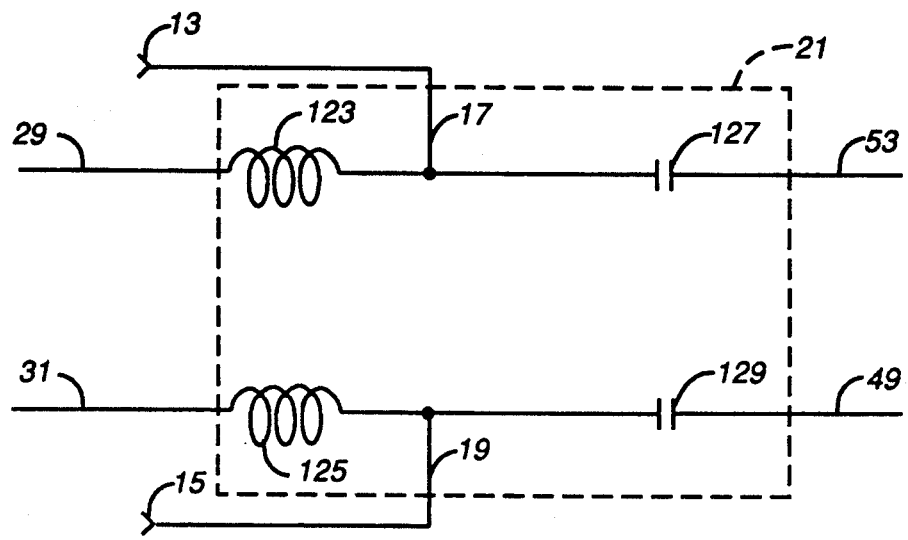
FIG._10
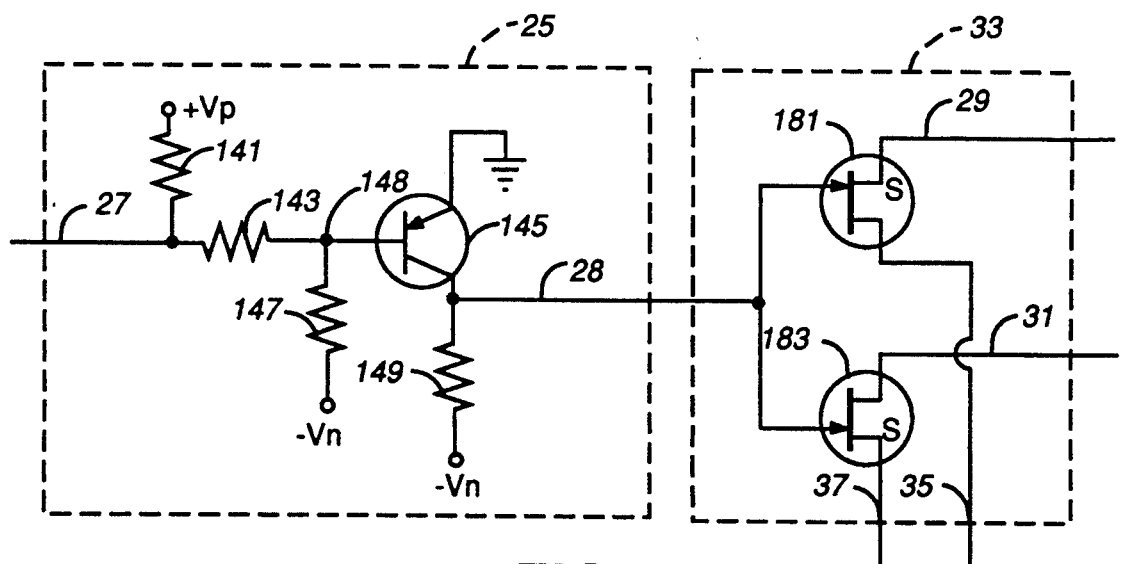
FIG._11

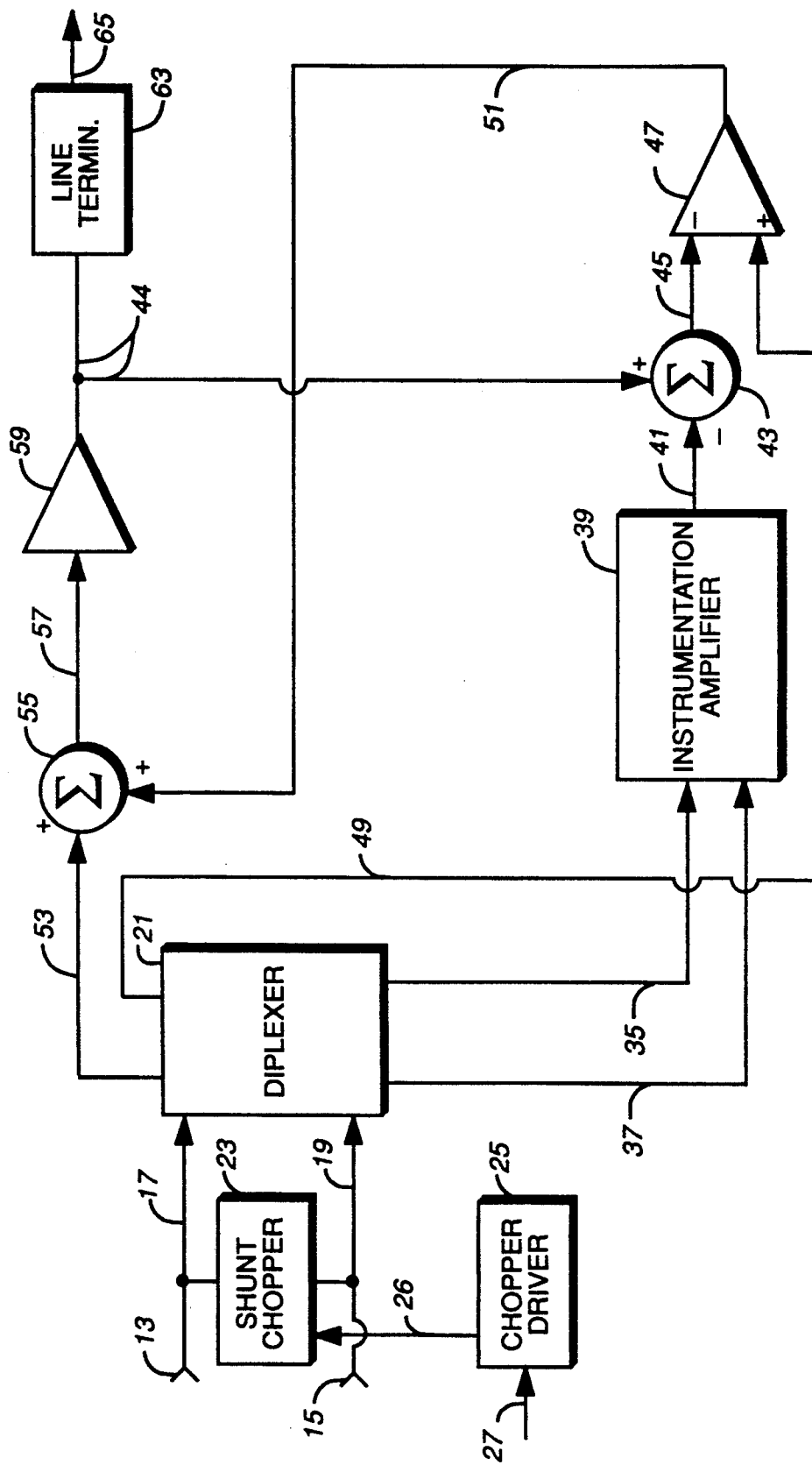
FIG._12

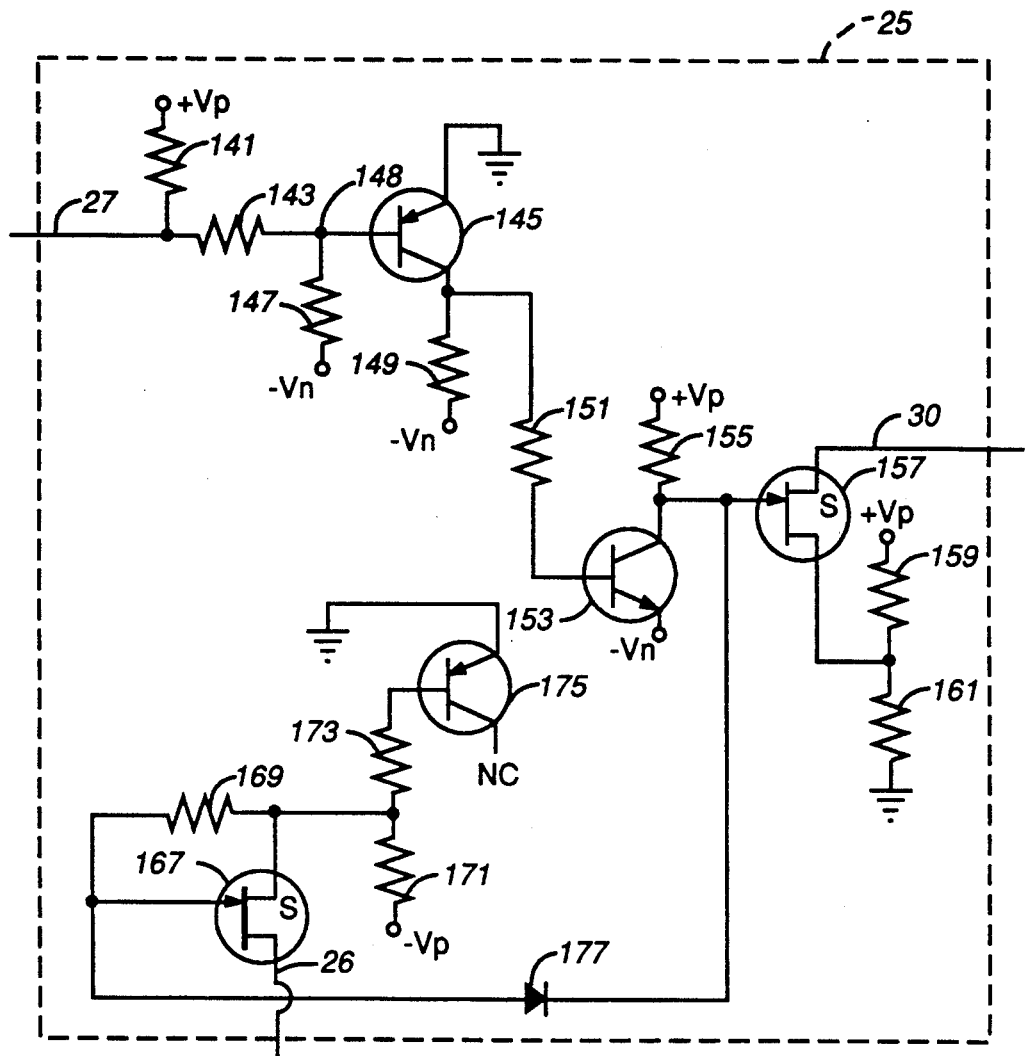
FIG._13
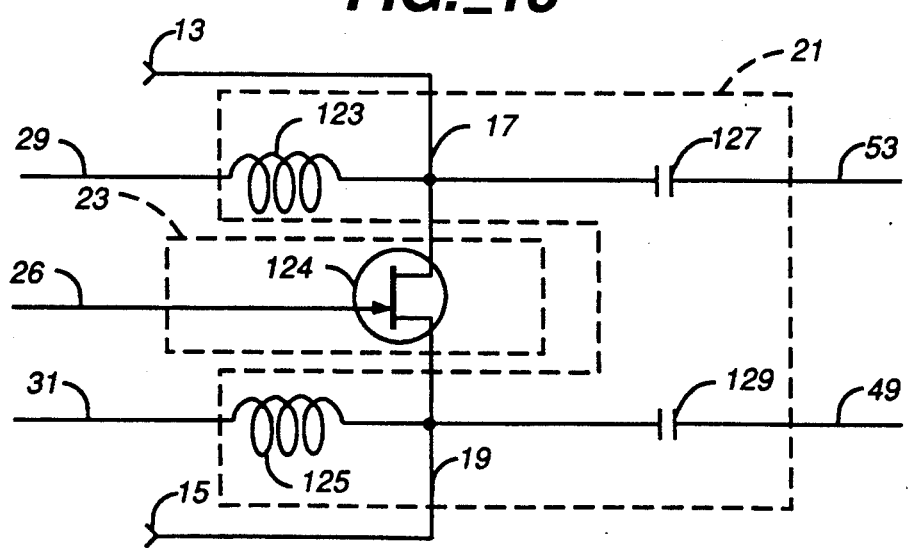
FIG._15

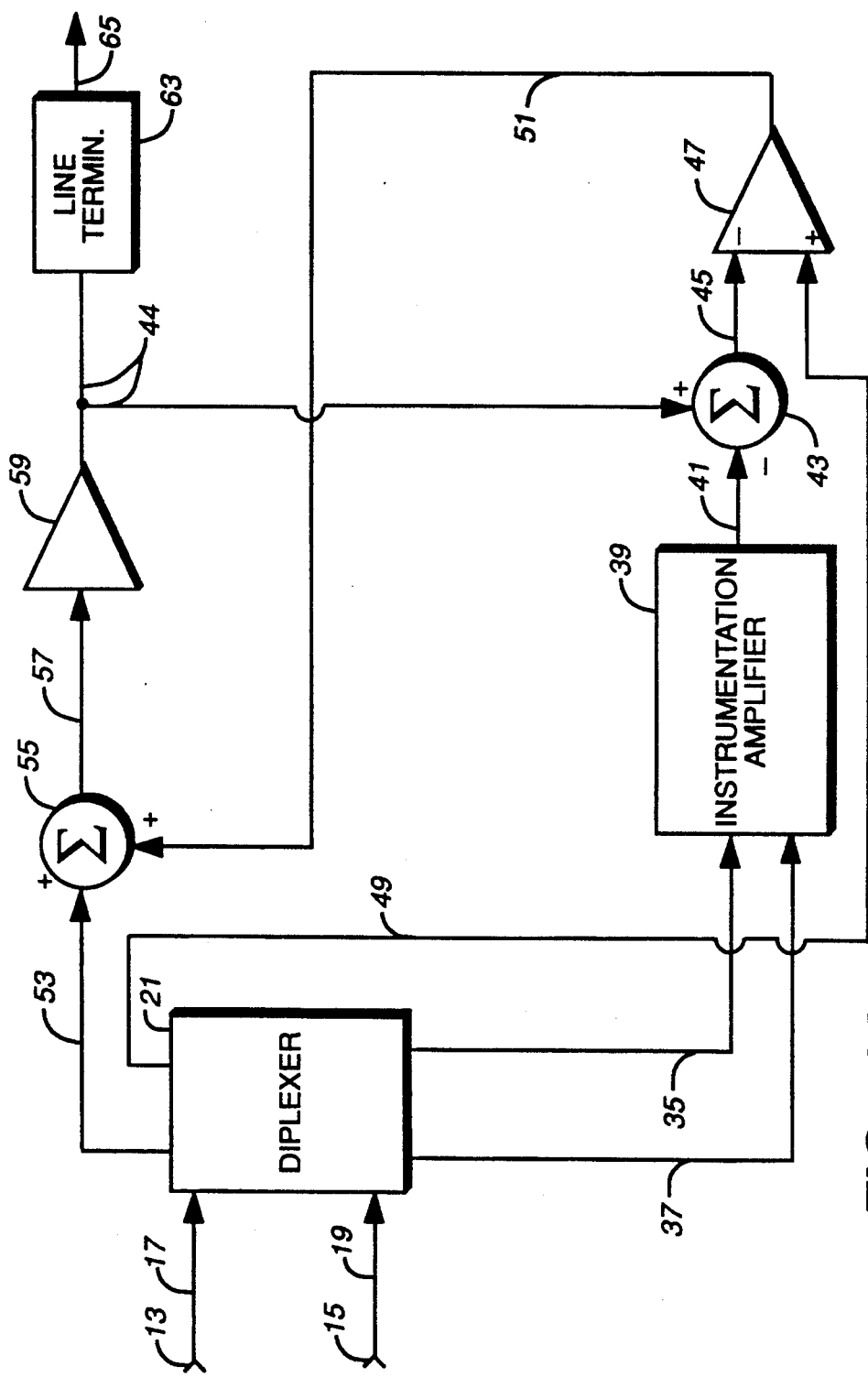
FIG._14

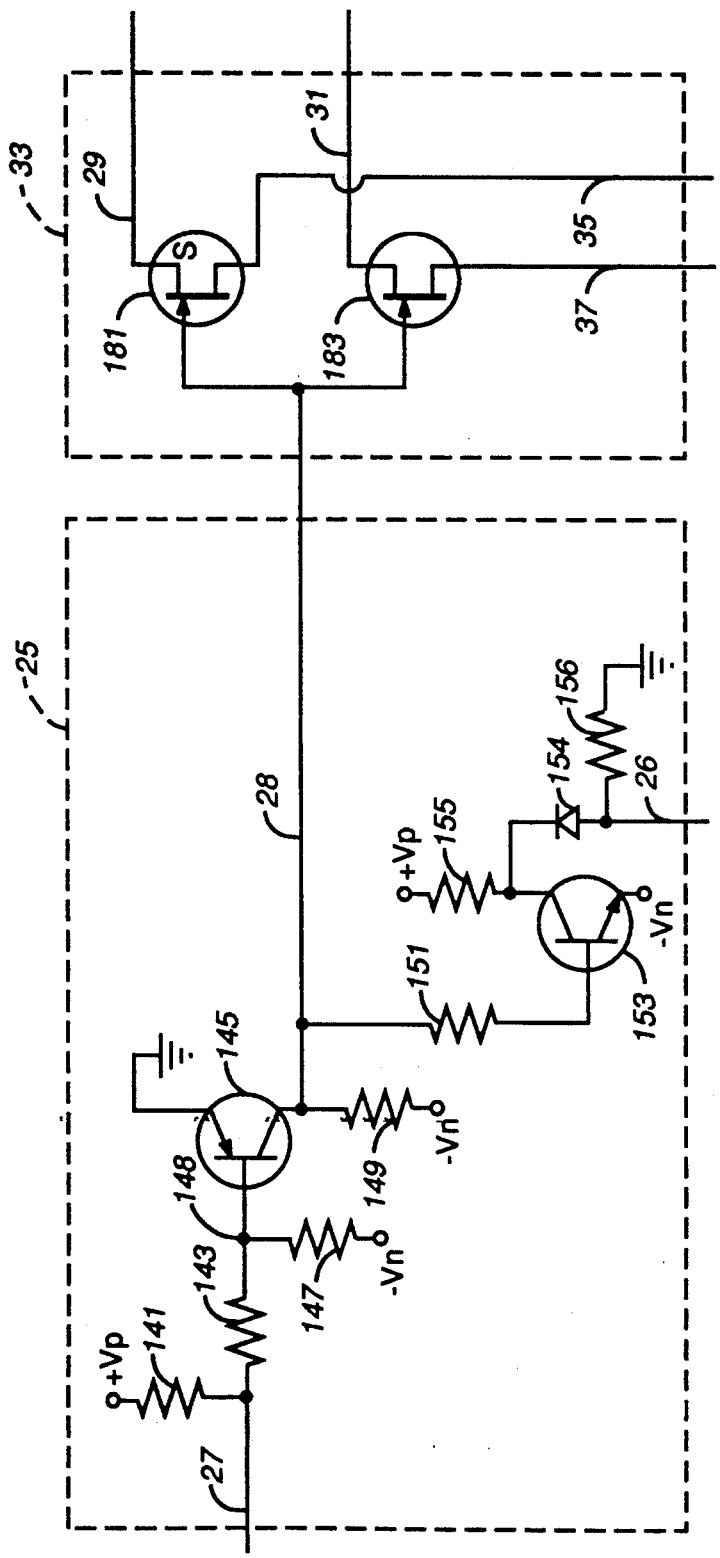
FIG._16
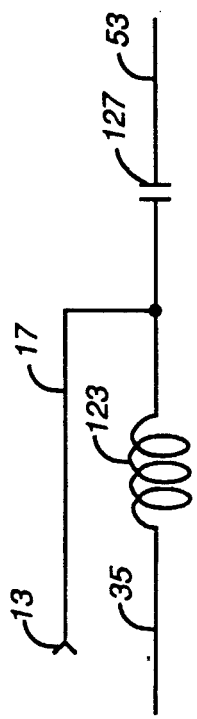
FIG._18

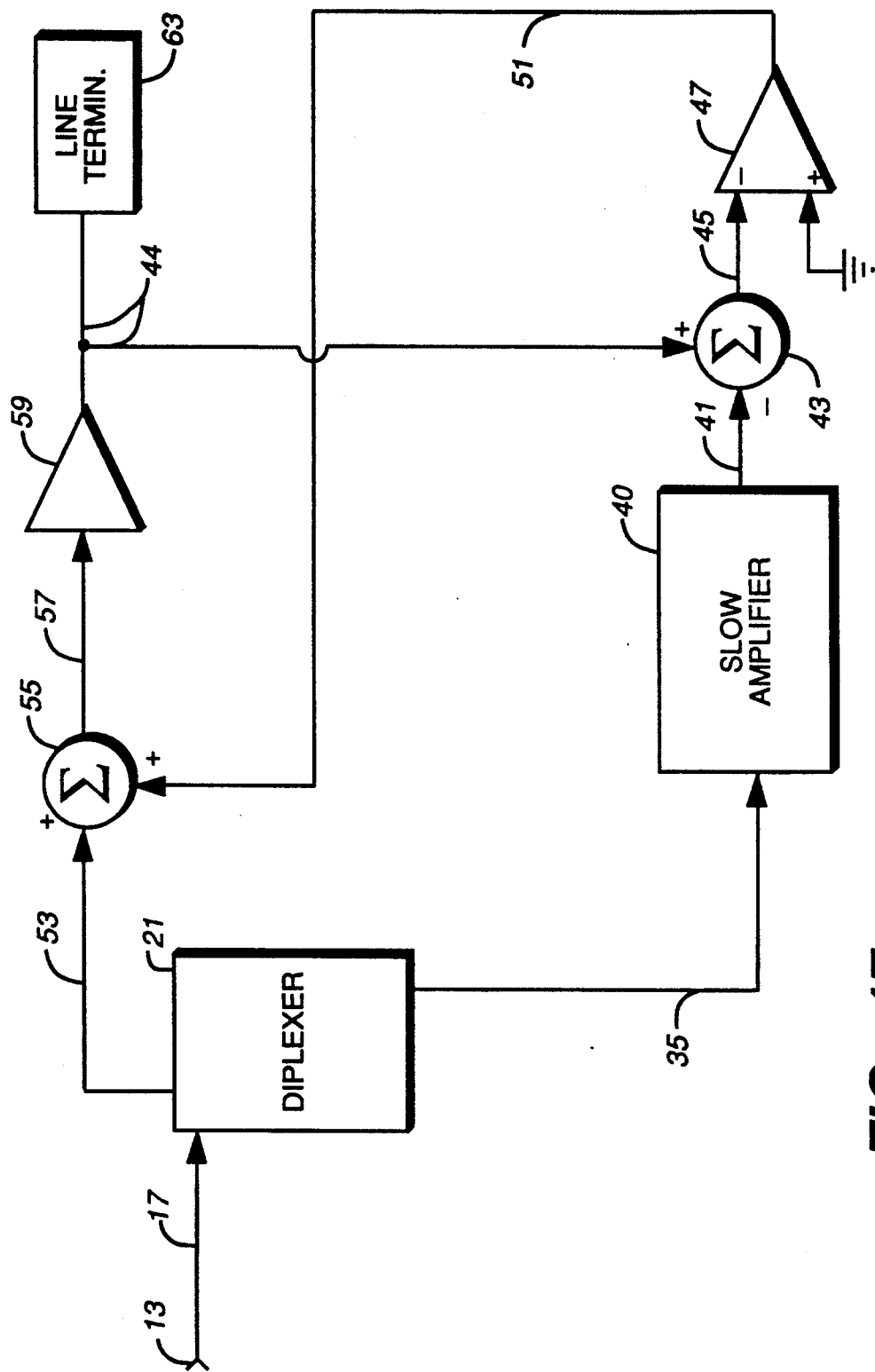
FIG._17

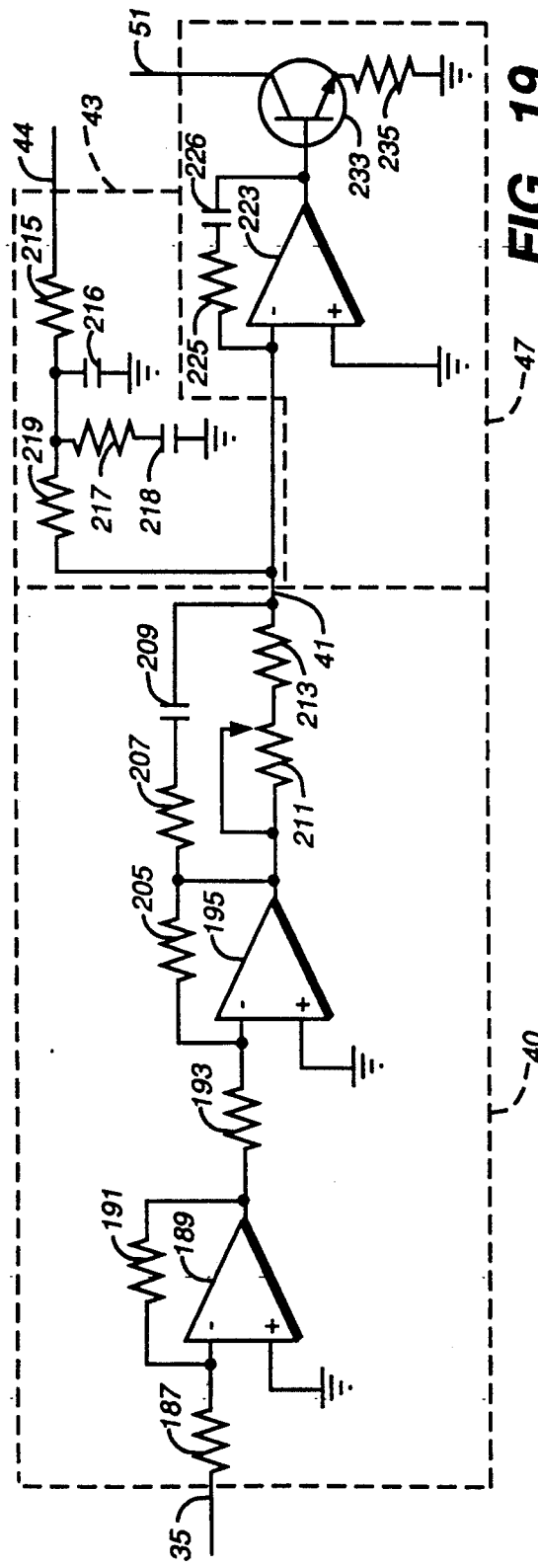
FIG._19
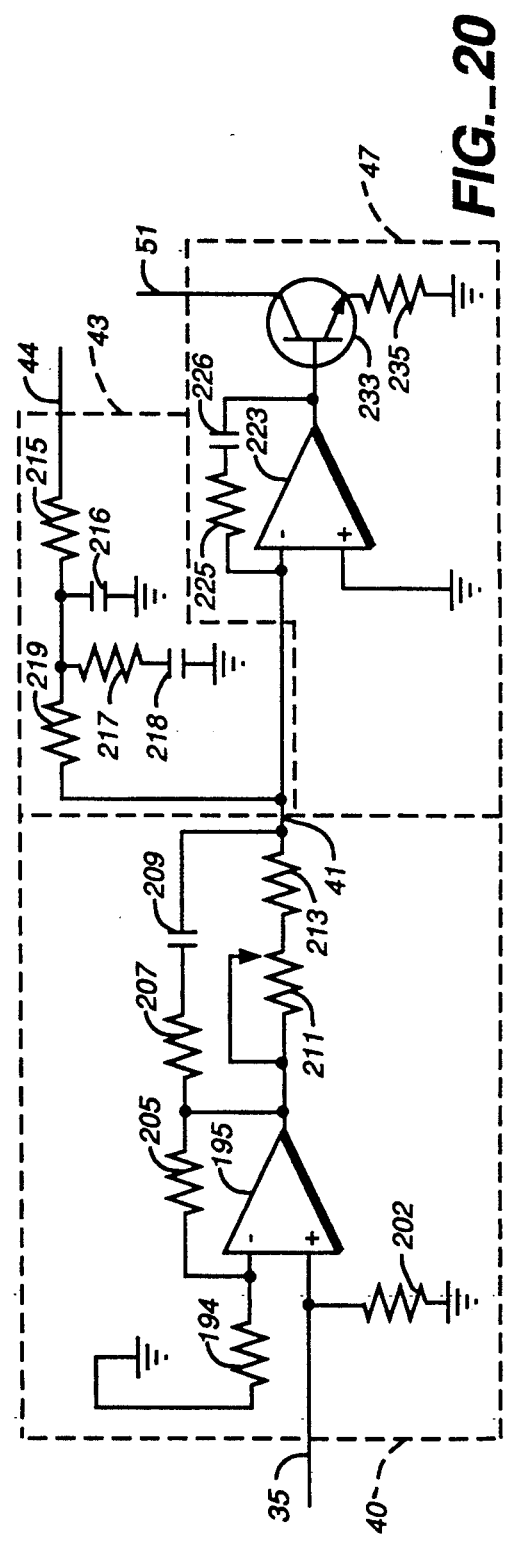
FIG._20

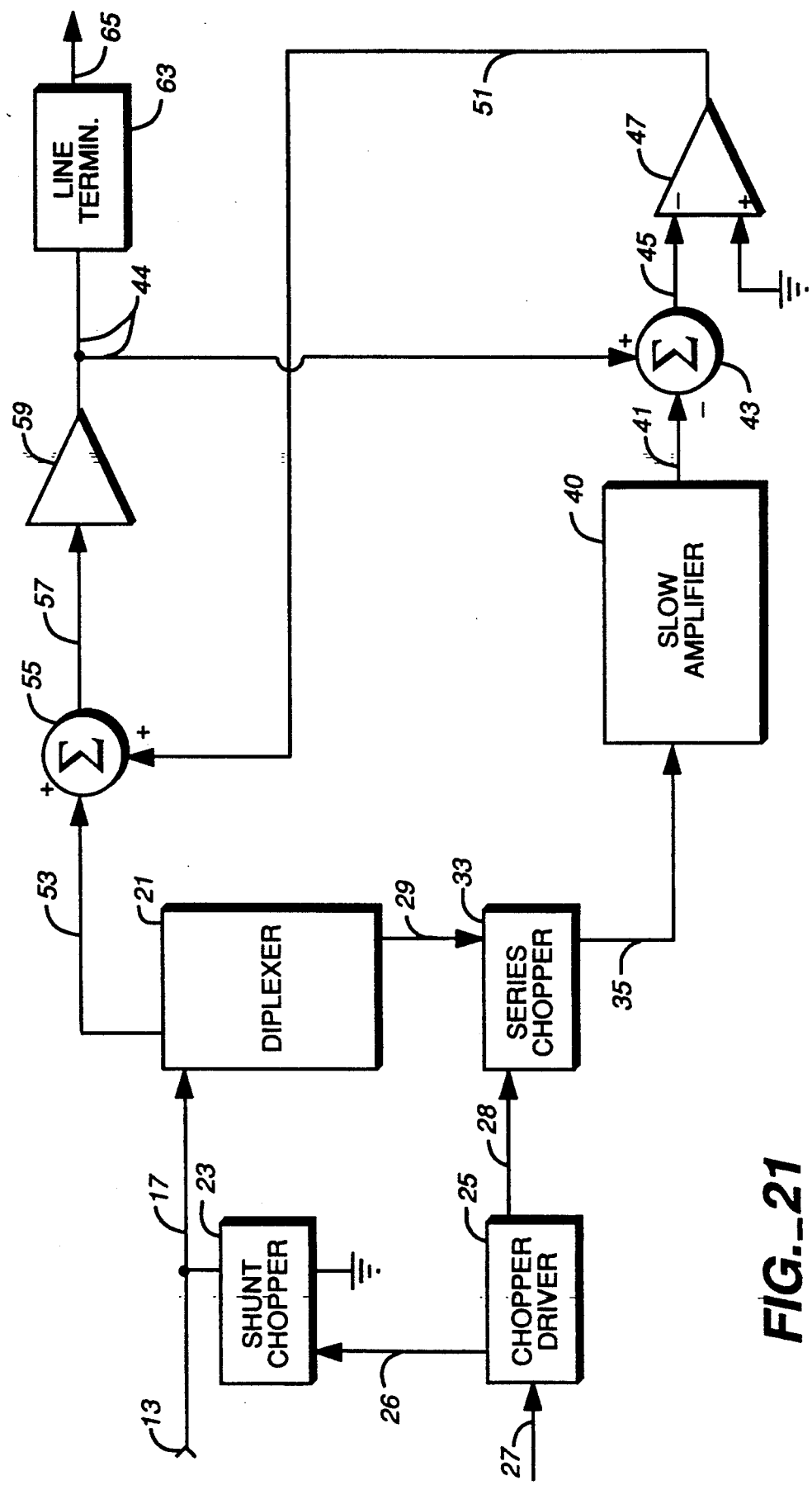
FIG._21

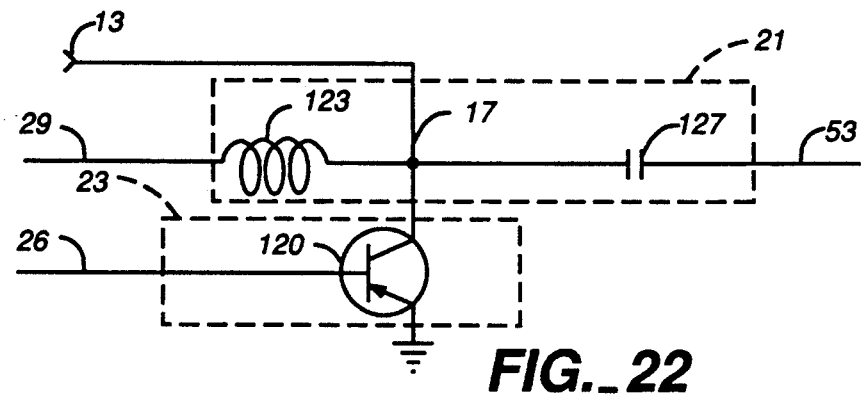
FIG._22
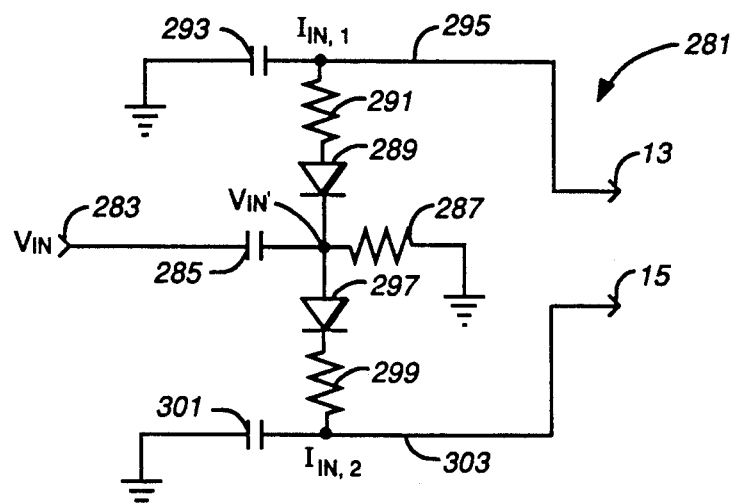
FIG._25
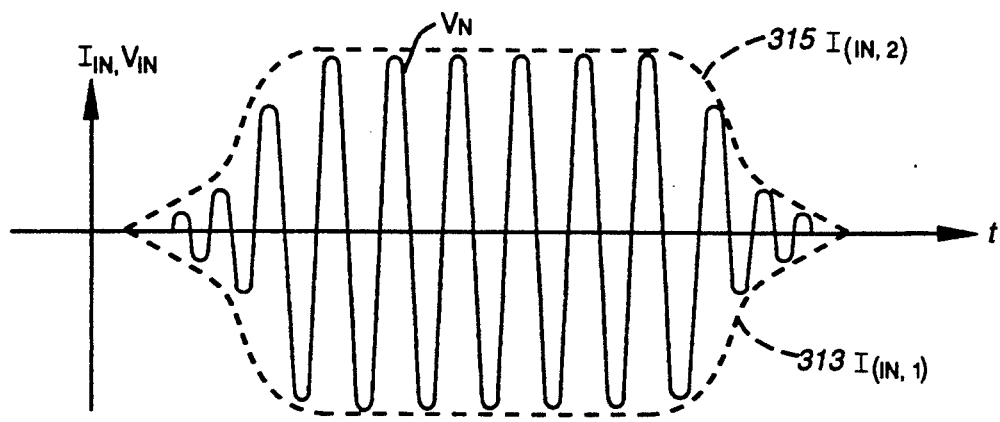
FIG._26

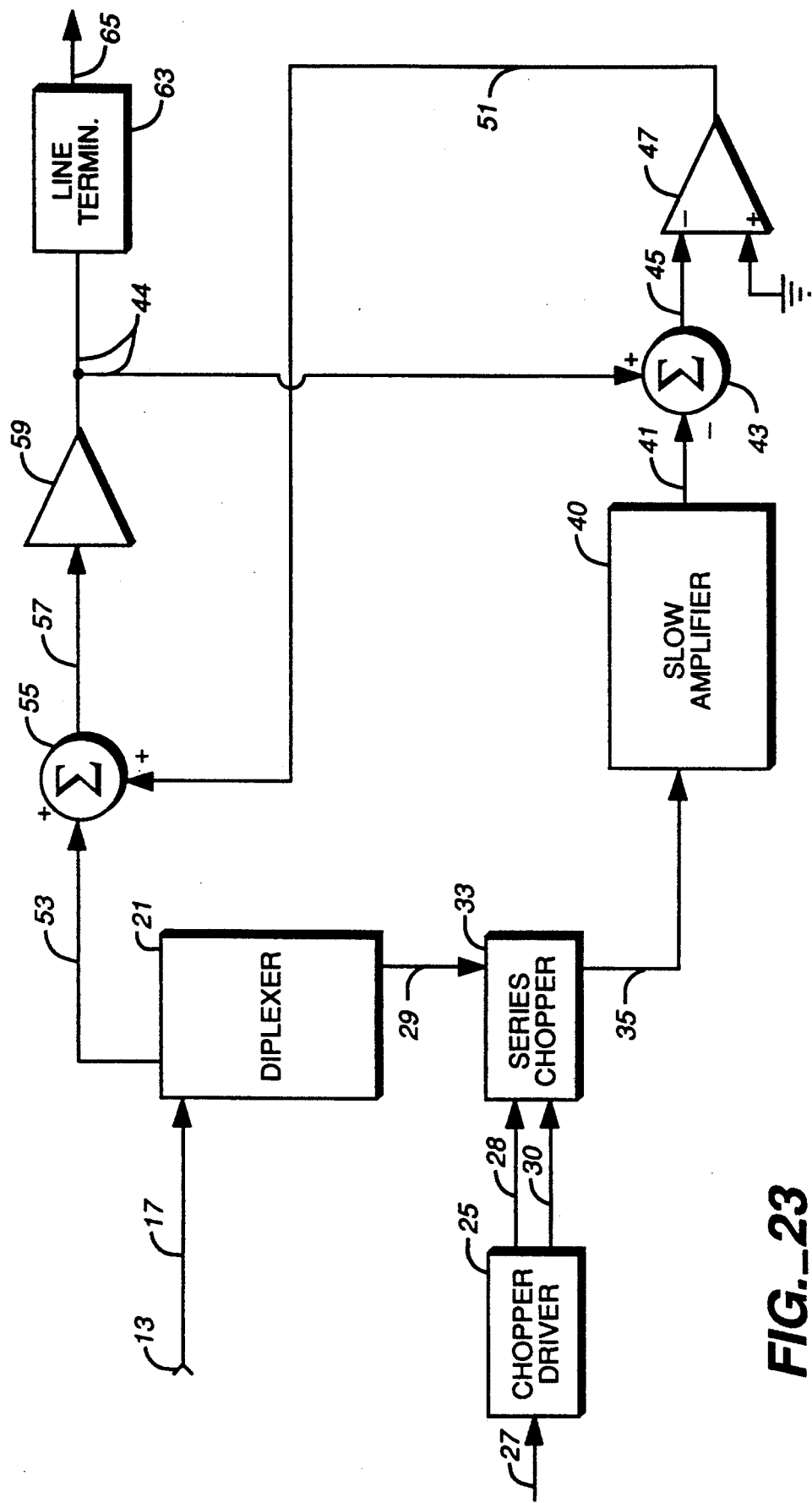
FIG._23

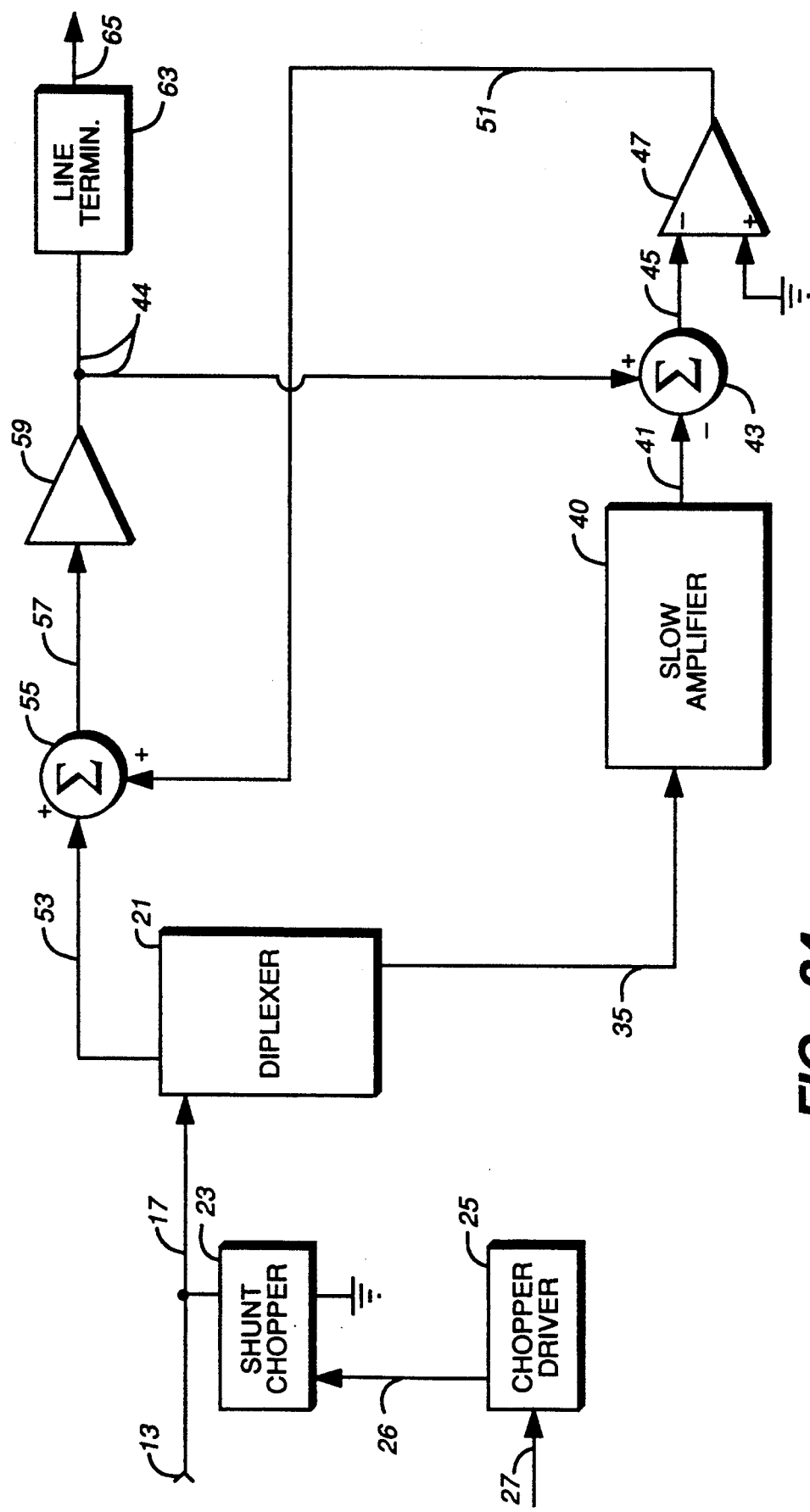
FIG._24

AMPLIFIER WITH WIDE DYNAMIC RANGE

DESCRIPTION

1. Technical Field

This invention relates to amplification of electrical signals.

2. Background of the Invention

Amplification of an electrical signal over a wide range of frequencies and over a wide dynamic range is attractive for instruments that will be used to analyze and process a variety of such signals. In U.S. Pat. No. 4,636,743, Cotreau discloses a front end of an operational amplifier that has a first stage to process signals with slew rates below a certain threshold and has a second, parallel stage to process signals with slew rates that exceed that threshold. The first stage provides a transconductance output that is linearly proportional to the input signal, up to the slew rate threshold. Increased output current is available for input signals whose slew rates exceed the threshold. In the related U.S. Pat. No. 4,636,744, King and Hernandez disclose a similar front end for an operational amplifier, with a pair of differential amplifiers being provided in the first stage and in the second stage for additional output improvements.

Chow, in U.S. Pat. No. 4,091,414, discloses separation of an electrical signal into a low frequency (LF) component and a high frequency (HF) component, with the amplitude of the LF component being limited relative to the amplitude of the HF component in order to preserve the finer detail contained in the HF component. The components are later added to produce a composite output signal.

In U.S. Pat. No. 4,281,295, Nishimura et al. disclose use of a non-linear expander/compressor device to logarithmically scale the magnitude of an incoming electrical signal according to which of several frequency regions the incoming signal belongs. The outputs are later added to produce a composite output signal. A negative feedback circuit is used to implement the expander/compressor device.

A chopper-stabilized amplifier is disclosed by Cioppi in U.S. Pat. No. 4,775,237 and is used to correct for input offset currents and for temperature drift of electrical components. This amplifier is connected to the input of a voltage-to-frequency converter, and a frequency counter is employed to determine the frequency and thus the voltage associated with an incoming signal.

Fanshel discloses a gain control device for eliminating low frequency noise for a speech signal in U.S. Pat. No. 4,837,832. A low frequency component (600–1200 Hz.) and a higher frequency component (1700–4600 Hz.) are formed, the dynamic range of the higher frequency component is compressed, and the two resulting components are recombined to form a signal in which the higher frequency contributions to speech can be enhanced.

Ideally, a wideband amplifier, with rise and fall response times of the order of one nanosecond ("nsec") or less, should have a dynamic range of 100 dB or better over a range of signal frequencies from zero to about one gigahertz ("GHz"). "Dynamic range", as used herein, is the decibel difference or ratio between the largest input signal which can be accepted without distortion products and the minimum discernible signal. Ideally, the input impedance should be very low and should be adjustable, and the output impedance should match that of a terminated line. The amplifier should accept time intervals between consecutive zero setting points of between milliseconds and hundreds of seconds, depending on the desired sensitivity and stability of the device and should be stable over many decades of input signal frequency.

SUMMARY OF THE INVENTION

These needs are met by an amplifier that provides two parallel paths for low and high frequency amplification with separate performance optimization for each. A series chopper may be aided by a shunt chopper for purposes of periodically resetting the zero voltage level of the input signal. Shunt chopping may be provided by a bipolar transistor, a PIN diode, or other device that has very low impedance in the "on" state.

The shunt chopper and the series chopper are driven by the same chopper driver and are so arranged that, when the shunt chopper is active to suppress appearance of an incoming signal the series chopper is also active, and inversely In one path, a portion of a series-chopped input signal is passed to a difference amplifier ("slow amplifier") module that is optimized for low signal frequencies such as 0–100 kilohertz ("KHz"). In a second path another portion of the series chopped input signal has been passed through an amplifier ("fast amplifier") module that is optimized for operation at high signal frequencies such as 0.01–300 megahertz ("MHz"). Outputs of the slow and fast amplifiers are combined to yield an output signal which has a greater dynamic range characteristic over wide bandwidths then available from a single amplifier.

BRIEF DESCRIPTION OF THE DRAWINGS

FIG. 1 is a block diagram of the major components of one embodiment of the invention.

FIG. 2 is a schematic view, showing individual electrical components according to one embodiment of the diplexer module and shunt chopper module from FIG. 1.

FIG. 2A is a schematic view of an alternate embodiment of the diplexer module and shunt module shown in FIG. 2, with one output signal line deleted.

FIG. 3 is a schematic view, showing individual electrical components according to one embodiment of the chopper driver module and series chopper module from FIG. 1.

FIG. 4 is a schematic view, showing individual electrical components according to one embodiment of the instrumentation amplifier module, first summing circuit and error amplifier module from FIG. 1

FIG. 5 is a schematic view, showing individual electrical components according to one embodiment of the fast amplifier module, second summing circuit and line termination module from FIG. 1.

FIG. 6 is a graphic view of the development with time of the input signals received by the device shown in FIG. 1 and certain intermediate signals formed within this device.

FIG. 7 is a schematic view showing individual electrical components according to a second embodiment of the diplexer module and shunt chopper module.

FIG. 8 is a schematic view showing individual electrical components according to a second embodiment of the chopper driver and series chopper modules.

FIG. 9 is a block diagram of the major components of another embodiment of the invention.

FIG. 10 is a schematic view showing individual electrical components according to a third embodiment of the diplexer module.

FIG. 11 is a schematic view showing individual electrical components according to a third embodiment of the chopper driver and series chopper modules.

FIG. 12 is a block diagram of the major components of another embodiment of the invention.

FIG. 13 is a schematic view, showing individual electrical components according to a fourth embodiment of the chopper driver module.

FIG. 14 is a block diagram of the major components of another embodiment of the invention.

FIG. 15 is a schematic view showing individual electrical components according to a fourth embodiment of the diplexer module and shunt chopper module.

FIG. 16 is a schematic view showing individual electrical components according to a fifth embodiment of the chopper driver and series chopper modules.

FIG. 17 is a block diagram of the major components of another embodiment of the invention.

FIG. 18 is a schematic view showing individual electrical components according to a fifth embodiment of the diplexer module.

FIGS. 19 and 20 are schematic views showing individual electrical components according to second and third embodiments of the slow amplifier module.

FIG. 21 is a block diagram of the major components of another embodiment of the invention.

FIG. 22 is a schematic view showing individual electrical components according to a sixth embodiment of the diplexer module and shunt chopper module.

FIG. 23 is a block diagram of the major components of another embodiment of the invention.

FIG. 24 is a block diagram of the major components of another embodiment of the invention.

FIG. 25 is a schematic view of a positive and negative signal envelope detector that is suitable to provide two input signals for the invention.

FIG. 26 is a graphic view illustrating a typical input signal and two envelope signals provided as output signals by the apparatus shown in FIG. 25.

BEST MODE FOR CARRYING OUT THE INVENTION

With reference to FIG. 1, the invention in one embodiment 11 provides accurate signal amplification for input frequencies from dc to 300 MHz, with chopped processing and including zeroing, for rf envelope detection and peak detection. The amplifier 11 incorporates two complementary input signal chopping devices. The amplifier 11 further provides two parallel paths for low frequency and high frequency signal amplification, respectively, and each path can be separately optimized over a voltage range from 0.5 volts to 0.5 volts to achieve the desired result described above.

Two input signals $v_{in,1}$ and $v_{in,2}$ of opposite polarity and approximately equal magnitude, which may represent the lower and upper envelopes of an rf signal to be analyzed, arrive at two input terminals 13 and 15, respectively. The input signals $v_{in,1}$ and $v_{in,2}$ propagate along input signal lines 17 and 19, respectively, and are received by a diplexer module 21 that will provide high frequency and low frequency component signals from the input signals received. A shunt chopper module 23 is connected between the input signal lines 17 and 19 to provide a first chopping opportunity by forcing near-coincidence of the voltages on these two signal lines in each of a sequence of time intervals. These shunt chopper time intervals are determined by a chopper driver module 25 that drives the shunt chopper module 23. The chopper driver module 25 receives a chopper activation signal on a signal line 27 and in turn produces an activation signal for the shunt chopper module 23, with a time delay of at most 100 nanoseconds. In operation, the chopper driver module 25 might activate the shunt chopper module 23 approximately once every 0.1 seconds for some envelope or peak detection applications, but the preferred embodiment allows chopper activation at regularly or irregularly spaced time points from a fraction of a millisecond to tens of seconds.

The diplexer module 21 receives the two input signals on the input signal lines 17 and 19 and provides high frequency discrimination by passing these signals through low pass filter circuits. Output signals from these low pass filter circuits are passed by two signal lines 29 and 31 to a series chopper module 33 that is also driven by two signal lines 28 and 30 from the chopper driver module 25. When the shunt chopper module 23 is inactivated so that the two input signals on the lines 17 and 19 are independent of one another, the series chopper module 33 also passes these two signals without interference. When the chopper signal is active so that the two input signals are forced to coincide (shunt chopper active), the series chopper module blocks passage of the two input signals (series chopper active). When the series chopper module 33 is inactive, the two incoming signals received by this module on signal lines 29 and 31 are passed on two signal lines 35 and 37 to two input terminals of an instrumentation amplifier module 39 for low frequency feedback amplification, to form and issue a weighted difference of these two incoming signals on a signal line 41. When the series chopper module 33 is active, the two incoming signals received on the signal lines 29 and 31 are substantially the same, and the outgoing signal on the signal line 41 is approximately zero. When the series chopper module 33 is inactive, the incoming (current) signals received on the signal lines 29 and 31 have opposite polarities but substantially the same magnitude so that a non-zero signal issues on the signal line 41.

The outgoing signal on the signal line 41 is received by an input terminal on a signal sum-forming circuit 43 that also receives another incoming signal, to be described below, of opposite polarity on another signal line 44. The resulting (difference) signal is issued on a signal line 45 and is received at the negative input terminal of an error amplifier module 47. The positive input terminal of the amplifier module 47 receives an incoming signal on a signal line 49 from the diplexer module 21. The signal on the line 49 is formed by passing the input signal received by the diplexer module 21 on the signal line 19 through a high pass filter in the diplexer module.

The error amplifier module 47 issues a weighted difference output signal on a signal line 51, and this signal is received by an input terminal of a second sum-forming circuit 55. The input signal received on the signal line 17 by the diplexer module 21 is passed through a high pass filter in the diplexer module and is issued on a signal line 53 that is received by a second input terminal of the summing circuit 55. The summed output from the second summing circuit 55 is passed on a signal line 57 to a high frequency amplifier module 59. The composite outgoing signal from the amplifier module 59 is received on the signal line 44 and is passed to one of the input terminals of the difference-forming circuit 43 and to a low impedance line termination module 63 whose output impedance is approximately 50 ohms.

FIG. 2 illustrates an arrangement of electrical components that may be used for the diplexer module 21 and shunt chopper module 23 shown in FIG. 1. The two signal input lines 17 and 19 are connected to the collector and emitter, respectively, of pnp bipolar junction transistor ("pnp BJT") 121 whose base receives a signal on the signal line 26 from the chopper driver module of FIG. 1 (not shown in FIG. 2). The collector of the BJT 121 is connected in series through an inductor 123 to the signal line 29 that will feed the series chopper module 33 in FIG. 1 (not shown in FIG. 2) and is connected through a capacitor 127, positioned in the diplexer module 21, to the signal line 53. The emitter of the BJT 121 is connected through an inductor 125 to the signal line 31 that feeds the series chopper module 33 in FIG. 1. The emitter of the BJT 121 is also connected through a capacitor 129, positioned in the diplexer module 21, to the signal line 49. In a preferred embodiment, the inductance values of the inductors 123 and 125 are 22 $\mu$henrys each and the capacitance values of the capacitors 127 and 129 are 200 nF each. The BJT 121 is preferably an MMBT4403. The capacitors 127 and 129 may be positioned in the second summing circuit 55 and error amplifier module 47, respectively. The inductors 123 and 125 may be positioned in the series chopper module 33.

When the base of the BJT 121 receives a voltage signal whose value is at least 0.7 volts below the value of the voltage signal presently received on the input line 19, the BJT turns on and forces the collector and emitter voltages to come into approximate agreement (within ten millivolts) while the BJT remains in the on state. If the BJT 121 is fully off, the input signals received on the input lines 17 and 19 continue along the respective signal lines (53 and 29 for the input line 17, 49 and 31 for the input line 19) independently of one another. The capacitors 127 and 129 each act as high pass filters so that only the high frequency components of input signals received on the input lines 17 and 19 are passed to the signal lines 53 and 49, respectively.

FIG. 3 illustrates an arrangement of electrical components that may be used for the chopper driver module 25 and the series chopper module 33 in one embodiment of the invention. A chopper command signal is received on the chopper input signal line 27, which is connected to a positive voltage supply $+V_p$ through a resistor 141. The chopper signal line 27 is also connected through a resistor 143 to the base of a pnp BJT 145 whose emitter is grounded. The base and collector of the BJT 145 are each connected to a negative voltage supply $-V_n$ through respective resistors 147 and 149. The signal line 28 is connected to the collector of the BJT 145 and carries a chopper activation signal to the series chopper module 33. The signal line 28 is connected through a resistor 151 to the base of an npn bipolar junction transistor ("npn BJT") 153 whose emitter is connected to the negative voltage supply $-V_n$. The collector of the BJT 153 is connected through a resistor 155 to the positive voltage supply $+V_p$. The collector of the BJT 153 is connected to the gate of a field effect transistor ("FET") 157 whose source terminal S is connected to the signal line 30 that drives the series chopper module 33 in FIG. 1. The drain terminal of the FET 157 is connected to a positive voltage supply $+V_p$ through a resistor 159 and is connected to ground through a resistor 161.

An FET 167 has its source and gate terminals connected through a resistor 169, with the gate terminal thereof being connected to an anode of a diode 177 whose cathode is connected to the collector of the BJT 153. The source terminal of the FET 167 is connected to a negative voltage supply $-V_n$ through a resistor 171 and is connected through a resistor 173 to the base of a pnp BJT 175 that acts as a diode here. The emitter of the BJT 175 is grounded, and the collector is allowed to float. The signal line 26, connected to the drain of the FET 167 and to the base of the BJT 121 in the shunt chopper module 23 in FIG. 1, supplies the negative voltage needed to forward bias the base-emitter junction of the BJT 121 while the emitter voltage of BJT 121 remains near zero.

The series chopper module 33 shown in FIG. 3 includes two FETs 181 and 183 whose gate terminals are connected to the collector of the BJT 145 through the signal line 28. The source terminal of the FET 181 and the drain terminal of the FET 183 are connected to the respective signal lines 29 and 31 to receive signals from the diplexer module 21 shown in FIG. 2. The drain terminal of the FET 181 and the source terminal of the FET 183 are connected to the signal lines 35 and 37 that feed signals to the instrumentation amplifier 39 shown in FIG. 1. The gate voltage of the FET 167, acting through the diode 177 and through the gate of the FET 157, provides positive voltage bias for the signal line 31 that delivers a positive voltage envelope input signal to the drain of the FET 183.

In a preferred embodiment, the resistance values of the resistors 141, 143, 147, 149, 151, 155, 159, 161, 169, 171 and 173 are 10 kilo-ohms, 10 kilo-ohms, 56 kilo-ohms, 10 kilo-ohms, 100 kilo-ohms, 100 kilo-ohms, 1.33 kilo-ohms, 29 ohms, 100 kilo-ohms, 1.33 kilo-ohms and 68 ohms, respectively; and the positive and negative voltage supplies have voltage values $+V_p = +5$ volts and $-V_n = -12$ volts. The npn and pnp BJTs are preferably MMBT3904 and MMBT3906, respectively, the FETs 181 and 183 are preferably J105, and the FETs 157 and 167 are preferably MMBF4393.

The chopper signal line 27 controls the gates of the FETs 181 and 183 that provide series chopping. If a signal of voltage $V < +0.5$ volts (including all negative voltages) arrives at the chopper driver module 25 on the chopper signal line 27, the current generated through the resistor 147 is split at the node 148, and part of this current passes through the emitter of the BJT 145 and turns the transistor on. This grounds the signal line 28 and the gates for the FETs 181 and 183 so that these transistors become fully conducting, with channel impedances of the order of 2-3 ohms. In this mode of operation the series chopper module 33 is inactive, and the incoming signals received by the series chopper module on the signal lines 29 and 31 are passed to the signal lines 35 and 37, respectively. If a signal of voltage $V > +2$ volts arrives at the chopper driver module 25 on the chopper signal line 27, the BJT 145 is turned off, and the voltage on the signal line 28 and at the gates of the FETs 181 and 183 becomes approximately $-V_n$. This voltage opens the channel at the FETs 181 and 183 so that the incoming signals received on signal lines 29 and 31 are blocked. No signals appear on the signal lines 35 and 37 in this chopper active mode.

The FET 157 furnishes a return path for the current to the emitter of the BJT 121 where a bias is applied to the base of the BJT 121. The FET 157 also supplies a small offset voltage, arising from the voltage that appears between the resistors 159 and 161, in order to keep the voltage on input line 19 near zero volts by partly compensating for the voltage drops that appear across the inductor 125 and the FET 157. When the series chopper module 33 is inactive, the BJT 153 is on and the gate region of the FET 157 is non-conducting. When the series chopper module 33 is active, the BJT 153 is off and the gate region of the FET 157 is substantially fully conducting. The BJT 121 is conducting (shunt chopping active) when the FETs 181 and 183 are non-conducting (series chopping active) and inversely.

FIG. 4 illustrates an arrangement of electrical components to provide the instrumentation amplifier module 39, the first summing circuit 43 and the error amplifier module 47 according to one embodiment of the invention. The signal line 35 is connected through a resistor 187 to the negative terminal of an operational amplifier ("op-amp.") 189 whose positive terminal is grounded. Feedback from the output terminal of the op-amp. 189 to the negative input terminal thereof is provided through a resistor 191, and the output signal from the op-amp. 189 is fed through a resistor 193 to the negative input terminal of an op-amp. 195. This negative input terminal is grounded through a resistor 204. The signal line 37 is connected through a resistor 197 to the negative terminal of an op-amp. 199 whose positive terminal is grounded Feedback from the output terminal to the negative input terminal of the op-amp. 199 is provided through a resistor 201, and the output terminal of this op-amp. is connected through a resistor 203 to the positive terminal of the op-amp. 195. Feedback is provided from the output terminal to the negative input terminal of the op-amp. 195 through a resistor 205. The output terminal of the op-amp. 195 is connected to the signal line 41 through a resistor 207 and a capacitor 209 connected in series. The output terminal of the op-amp. 195 is also connected to the signal line 41 through a variable resistor 211 and a fixed value resistor 213 connected in series. The variable resistor 211 is used to adjust the gain of the instrumentation amplifier 39 to match the gain of the fast amplifier module 59 in FIG. 1.

The resistance values for the resistors 187 and 197, approximately 7 ohms each in a preferred embodiment, are chosen to properly terminate the diplexer module 21. The total of the on-resistances of each of the FETs 181 and 183 (about 3 ohms each) plus the resistance values for the respective resistors 187 and 197 are about 10 ohms. Each of the signal lines 49, 53, 29 and 31 of the diplexer module 21 is terminated with 10 ohms resistance, and the inductance values of the inductors 123 and 125 and the capacitance values of the capacitors 127 and 129 in FIG. 2 are chosen to match a 10 ohm impedance level. Thus, the loads seen by each of the input signals arriving on the input lines 17 and 19 are also 10 ohms each and are approximately constant over a range of frequencies from zero to 300 MHz. This 10 ohm loading effectively provides a short circuit load to the envelope detector, thus forcing the detector to operate in a current mode rather than in the conventional peak voltage detection mode. This offers advantages such as higher speed envelope response and reduced sensitivity to errors from harmonic content of the rf input signal.

The resistance values of the resistors 191 and 201 are chosen to provide a 100 ohm transresistance to transform currents from the envelope detector 281 into voltages of 100 times the currents. The resistance values of the resistors 191, 193, 201, 203, 204, 205, 207, 211 and 213 in a preferred embodiment are 100, 1000, 100, 1000, 1000, 1000, 12100, 500(maximum) and 1620 ohms, respectively. The capacitor 209 has a capacitance value of 0.18 nF in a preferred embodiment. The circuit consisting of the resistors 207, 211 and 213 and the capacitor 209 introduces a frequency-dependent phase lead, relative to a purely resistive circuit, that rises to approximately 5° at a frequency of about 132 KHz and decreases slowly on either side of this frequency. This compensates for op-amp. propagation delays and smoothes the pulse response of the total amplifier.

The summing circuit 43 shown in FIG. 4 includes a first resistor 215 and a second resistor 219 connected in series to the signal line 44, with a common terminal of these two resistors being grounded through a capacitor 216 and through a series combination of a resistor 217 and a capacitor 218. The signal line 44 is connected through the two resistors 215 and 219 to a node point 221. Node point 221 also receives a signal on the signal line 41 from the instrumentation amplifier module 39 and forms a sum of these two signals. This sum is actually a difference of the two signals because of the different signal polarities. The module 43 shown in FIG. 4 provides low pass filtering and time delay to receive a signal generated by the fast amplifier module 59 shown in FIG. 1.

In a preferred embodiment, the resistors 215, 217 and 219 will have resistance values of 511, 6810 and 464 ohms, respectively; and the capacitors 216 and 218 will have capacitance values of 10 and 2.2 nF, respectively.

With reference to the error amplifier module 47 in FIG. 4, the signal line 45 connects the node 221 and the negative input terminal of an op-amp. 223. The positive input terminal of the op-amp. 223 is connected to the signal line 49 through a resistor 228, with the signal line 49 being grounded through a resistor 227. The positive input terminal of the op-amp. 223 is grounded through a capacitor 229 and through a resistor 231, arranged in parallel. Feedback is provided from the output terminal of the op-amp. 223 to the negative input terminal through a resistor 225 and a capacitor 226 connected in series. The output terminal of the op-amp. 223 is connected to the base of an npn BJT 233 whose emitter is grounded through a resistor 235. The collector of the BJT 233 is connected to the signal line 51 to feed a signal to the second summing circuit 55 and fast amplifier module 59, which are described below.

In a preferred embodiment, the resistors 225, 227, 228, 231 and 235 have the resistance values 2370, 10, 562, 100 and 100 ohms, respectively, the capacitors 226 and 229 have the capacitance values 100 and 0.39 nF, respectively, and the BJT 233 is an MMBT 3904 npn transistor.

FIG. 5 illustrates an arrangement of electrical components that provide the second summing circuit 55, the fast amplifier module 59 and the line termination module 63 as indicated in FIG. 1. The summing circuit 55 includes a resistor 241 that connects the signal line 53 to a summing node 245 and includes a resistor 243 that connects the signal line 51 to the summing node 245. In a preferred embodiment, the resistors 241 and 243 have the resistance values 7 and 100 ohms, respectively. The resistance value of the resistor 241 is chosen to match the output impedance of the diplexer module 21, when combined with the input impedance of the bipolar transistor 247.

The fast amplifier module 59 includes a pnp BJT 247 whose base is connected by the signal line 57 to the summing node 245. The emitter of the BJT 247 is connected to the positive power supply $+V_n$ and is grounded through a capacitor 255. The base of the BJT 247 is connected to a positive power supply $+V_p$, through a resistor 248 and is connected to the collector of the BJT through a resistor 249 and a capacitor 251 connected in series. The collector of the BJT 247 is connected to a negative power supply $-V_p$ through a resistor 253 and is connected to the signal line 44. The BJT 247 is arranged in a pull-up configuration through the emitter and a pull-down configuration through the collector so that, if the BJT is off and no current flows through the resistor 249, the signal line 44 will have an approximately constant negative voltage value that is less negative than $-V_p$. If the BJT 247 is fully on, the voltage value on the signal line 44 will be approximately $+V_p$ volts.

In normal operation the BJT 247 conducts a quiescent current that holds the voltage on signal line 44 near zero. When a negative pulse of signal current is received on signal line 53, the BJT 247 conducts additional current to produce a positive voltage pulse on line 44. The signal path containing the resistor 249 provides negative feedback from the collector of BJT 247, in the form of current delivered to the line connected to the base terminal of this BJT. This provides the fast amplifier module with a transresistance near the resistance value of the resistor 249; this value is 121 ohms in a preferred embodiment.

In a preferred embodiment, the resistors 248, 249 and 253 have resistance values of 909, 121 and 158 ohms, respectively, the capacitors 251 and 255 have capacitance values of 47 and 100 nF, respectively, and the BJT 247 is an MRF5211 pnp transistor. The time constant associated with the combination of resistor 249 and capacitor 251 is about 5.7 μsec.

The line termination module 63 may include a resistor 261 that connects the signal line 44 to the output signal line 65. The output signal line 65 is grounded through a resistor 263. With this configuration, the output impedance of the apparatus as a whole will remain approximately constant, for output signal frequencies up to approximately 300 MHz, if the resistance values chosen for the resistors 261 and 263 are 56 ohms and 464 ohms, respectively.

With reference to FIGS. 1 and 2, the signal that arrives at the second summing circuit 55 and fast amplifier module 59 has passed through the capacitor 127 in the diplexer module 21, thereby passing all the higher frequency components of the signal current intact, while the lower frequency components will be increasingly attenuated. FIG. 6 graphically illustrates the time variation of signals 17S and 19S received on the input lines 17 and 19. A representative signal 53S flowing on signal line 53 is shown graphically as a function of time in FIG. 6. The output signal on signal line 44 from the fast amplifier module 59, denoted 44S in FIG. 6, follows signal 53S closely at first, being delayed only by the relatively small propagation delay of the fast amplifier.

After the signal 44S has passed through the summing circuit 43 shown in FIG. 4, the resulting signal that arrives at the summing node 221 in FIG. 4 has had its high frequency components attenuated, causing its leading edge to rise much more slowly. The input signals received at the negative input terminals of the amplifiers 189 and 199 in FIG. 4 have been passed through the inductors 123 and 125, respectively, of the diplexer module 21 and have their high frequencies attenuated similarly to the signal that issues from the summing circuit 43. The output signal from the amplifier 195 in FIG. 4 (not shown in FIG. 6) also has this slow-rising leading edge. However, the output signal from amplifier 195 has been further delayed by the propagation delay within the op-amps 189, 199, and 195. This additional delay is compensated by the parallel resistive-capacitive circuit consisting of resistors 207, 211 and 213 and the capacitor 209, which adds a small phase lead.

The signal that arrives on the signal line 49, denoted 49S in FIG. 6, has opposite polarity to, but about the same magnitude as, the signal 53S, both of which have had their low frequencies attenuated. The signal 49S thus arrives at the positive terminal of the error amplifier module 47 in FIG. 1 at an earlier time than the time at which a sum signal 45S (FIG. 6) arrives at the negative input terminal of the error amplifier module 47. Resistors 228 and 231 and capacitor 229 attenuate and shape this signal to the degree necessary to compensate for the propagation delay in the amplifier 223 and BJT 233. The output signal on line 51 from the error amplifier module 47, denoted 51S in FIG. 6, thus rises slowly and has a shape that very nearly complements the fall of signal 53S. The combination of these two signals at the summing circuit 55 furnishes a drive signal to the fast amplifier module 59 that results in an early time contribution from the signal 53S and a later time contribution from the signal 51S. The sum of these two signals is amplified and issued as the output signal 44S from the fast amplifier module 59.

The signal line 49 shown in FIGS. 1, 4, 9, 10, 12, 14 and 15 may be deleted with no major effect on operation of the system. Where the signal line 49 is deleted in a two-input system, the capacitor 129 is retained to provide impedance balance and the remaining stub of the line is grounded through a resistor 130 having a resistance value of about 10 ohms, as shown in FIG. 2A.

The output signal from the second summing circuit 55 in FIG. 1 consists of an early-time contribution from the signal 53S and a later-time contribution from the signal 51S. The output signal 44S is the desired amplified output signal arising from the original input signals 17S and 19S in FIG. 6, during a time interval in which no chopping is occurring.

The preceding description covers an embodiment in which (1) both a shunt chopper module 23 and a series chopper module 33 are used and (2) the shunt chopper module 23 includes a BJT 121. In a second embodiment, the BJT 121 is replaced by a p-i-n diode 122, as shown in FIG. 7, and the chopper driver 25 and series chopper module 33 shown in FIG. 3 are replaced by the respective modules 25 and 33 shown in FIG. 8. In FIG. 8, the BJT 175 is deleted, and the signal line 26 is deleted and replaced by a signal line 24 connecting the drain of the FET 167 to the source of the FET 181, as shown. The signal line 24 provides negative voltage bias for the signal line 29 that delivers the negative envelope input signal to the source of the FET 181. The instrumentation amplifier module 39, first summing circuit 43, error amplifier module 47, second summing circuit 55, fast amplifier module 59 and line termination module 63 in FIGS. 4 and 5 are unchanged.

In a third embodiment, the shunt chopper module 23 shown in FIG. 1 is deleted and the chopper driver module 25 and series chopper module 33 are as shown in FIG. 8. The modules shown in FIGS. 4 and 5 are unchanged, the overall configuration is as shown in FIG. 9, and the diplexer module 21 is as shown in FIG. 10.

In a fourth embodiment, the shunt chopper module 23 is deleted, the overall configuration is as shown in FIG. 9, the diplexer module 21 is as shown in FIG. 10, the chopper driver module 25 and series chopper module 33 are as shown in FIG. 11, and the modules shown in FIGS. 4 and 5 are unchanged. In the chopper driver module 25 and series chopper module 33 shown in FIG. 11, the BJTs 153 and 175, the FETs 157 and 167, the resistors 151, 155, 159, 161, 169, 171 and 173, the associated connections to the power supplies $-V_p$, $-V_n$ and $+V_p$, the diode 177 and the signal line 30 are deleted from the modules shown in FIG. 3. The pnp BJT 145, driven by the chopper command signal line 27, drives the series chopper through the single signal line 28.

In a fifth embodiment, shown in an overall configuration FIG. 12, the series chopper module 33 is deleted from FIG. 1 and the signal lines 29 and 31, now identified with the signal lines 35 and 37, respectively, pass directly to the instrumentation amplifier module 39. The shunt chopper module 23 may rely on a BJT 121 as shown in FIG. 2. The diplexer module 21 in this embodiment is as shown in FIG. 2. The chopper driver module 25 is as shown in FIG. 13 where the BJT 121 supplies the shunt chopper action in the shunt chopper module 23. The instrumentation amplifier module 39, error amplifier module 47, fast amplifier module 59 and the summing circuits 43 and 55 are as shown in FIGS. 4 and 5.

In a sixth embodiment, the shunt chopper module 23, the series chopper driver module 25 and the series chopper module 33 are deleted and the overall configuration becomes as illustrated in FIG. 14. The two input signals $I_{in,1}$ and $I_{in,2}$ arrive at the diplexer module 21, which is arranged as in FIG. 10. The low frequency component signals are formed and passed by the inductors 123 and 125 to the signal lines 29 and 31, respectively, now identified with the respective signal lines 35 and 37. The high frequency component signals are formed and passed by the capacitors 127 and 129 to the signal lines 53 and 49, respectively. The signal lines 29 and 31, now identified with the signal lines 35 and 37, respectively, pass directly to the two input terminals of the instrumentation amplifier module 39, and the remainder of the operation of the device proceeds as in FIG. 1. The modules 39, 47 and 59 and the summing circuits 43 and 55 are as shown in FIGS. 4 and 5. As noted above, the two inductors 123 and 125, the capacitor 127 and the capacitor 129 may be positioned within the instrumentation amplifier module 39, the second summing circuit 55 and the error amplification module 47, respectively, so that the diplexer module 21 in FIG. 9 may be deleted.

In a seventh embodiment, the BJT 121 in the shunt chopper module 23 in FIG. 2 is replaced by an FET 124, as shown in FIG. 15. The chopper driver module 25 and series chopper module 33 are modified from FIG. 3, as shown in FIG. 16. The signal line 26 is now connected to the anode of a diode 154 and is grounded through a resistor 156. The cathode of the diode 154 is connected to the collector of the npn BJT 153. The instrumentation amplifier module 39, error amplifier module 47, fast amplifier module 59 and summing circuits 43 and 55 are as shown in FIGS. 4 and 5.

In an eighth embodiment, the series chopper module 33 in the seventh embodiment is deleted so that the overall configuration is as shown in FIG. 12. The diplexer module 21 and shunt chopper module 23 are again as shown in FIG. 15. The chopper driver module 25 is as shown in FIG. 16, but with the signal line 28 and the series chopper module 33 being deleted therein, and the signal lines 29 and 31 being identified with the signal lines 35 and 37. The instrumentation amplifier module 39, error amplifier module 47, fast amplifier module 59 and summing circuits 43 and 55 are as shown in FIGS. 4 and 5.

In embodiments 9-16, a single input signal $I_{in,1}$ is received by the system terminal 13 and passed by the signal line 17 to the diplexer module 21, and to the shunt chopper module 23 if this module is present. Signal lines 37, 49 and 31 are deleted in these embodiments.

In a ninth embodiment, shown in plan view in FIG. 17, no shunt chopper module, series chopper module or chopper driver module is included. The diplexer module 21, shown schematically in FIG. 18, passes this input signal through the inductor 123 to form a low frequency component signal and passes the low frequency component signal on the signal line 35 (identified with signal line 29) to a slow amplifier module 40, shown schematically in FIG. 19, to amplify this signal and issue the amplified signal as an output signal on signal line 41. The diplexer module 21 also passes the input signal through the capacitor 127 to form the high frequency component signal and passes the high frequency component signal to the second summing circuit 55 on the signal line 53. The first summing circuit 43 and error amplifier module 47 are as shown in FIG. 19, with the positive input terminal of the module 47 being grounded and the resistors 227, 228 and 231 and the capacitor 229 being deleted from the configuration shown in FIG. 4. The second summing circuit 55, fast amplifier module 59 and line termination module 63 are as shown in FIG. 5.

In the configuration of the slow amplifier module 40, shown in FIG. 19, and for the ninth embodiment, two stages of differential amplifiers 189 and 195 are used, with the signal line 35 being received by the negative input terminal of the amplifier 189. An alternative configuration for the slow amplifier module, shown in FIG. 20, may be used. The configuration of FIG. 20 uses a single stage differential amplifier 195, with the negative input terminal being grounded through a resistor 194 (about 10 ohms) and the positive input terminal thereof receiving the signal line 35. The positive input terminal of the amplifier 195 is grounded through a resistor 202 whose resistance value may be of the order of 10 ohms.

In a tenth embodiment, shown in plan view in FIG. 21, the shunt chopper module 23 and the series chopper module 33 are both present. The shunt chopper module 23 and diplexer module 21 are as shown in FIG. 22, where the BJT 120 has its emitter grounded, its base connected to the signal line 26 and its collector connected to the input signal line 17. The chopper driver module 25 and the series chopper module 33 are as shown in FIG. 3, but with the transistor 183, the connections of signal lines 28 and 30 to this transistor, the FET 157, and the resistors 159 and 161 being deleted. Returning to FIG. 21, the signal line 35 is received by the slow amplifier module 40, shown in two alternative embodiments in FIGS. 19 and 20; and the signal received is passed to the summing circuit 43 and then to error amplifier module 47 in the usual manner. The positive input terminal of the error amplifier module 47 is grounded. The second summing circuit 55 and fast amplifier module 59 are as shown in FIG. 5.

In an eleventh embodiment, illustrated in plan view in FIG. 21, the BJT 120 used in the shunt chopper module 23 is replaced by an FET in FIG. 22. The chopper driver module 25 of FIG. 3 is replaced by the alternative module 25 shown in FIG. 16, with the transistor 183 and the connection of signal line 28 to this transistor being deleted. The slow amplifier module 40, the summing circuit 43 and the error amplifier module 47 are as shown in FIG. 19 or FIG. 20. The second summing circuit 55 and the fast amplifier module 59 are as shown in FIG. 5.

In a twelfth embodiment, illustrated in plan view in FIG. 21, the BJT 120 used in the shunt chopper module 23 is replaced by a p-i-n diode in FIG. 22 and the signal line 26 is deleted. The chopper driver module 25 and the series chopper module 33 are as shown in FIG. 8, with the transistor 183, the connections of the signal lines 28 and 30 to this transistor, the FET 157, and the resistors 159 and 161 being deleted. The slow amplifier module 40, the summing circuit 43 and the error amplifier module 47 are as shown in FIG. 19 or FIG. 20. The second summing circuit 55 and the fast amplifier module 59 are as shown in FIG. 5.

A thirteenth embodiment deletes the shunt chopper module 23 and the chopper driver signal line 26 in FIG. 21. The chopper driver module 25 and the series chopper module 33 are as shown in FIG. 8, with the transistor 183, the connections of the signal lines 28 and 30 to this transistor, the FET 157, and the resistors 159 and 161 being deleted. The slow amplifier module 40, the summing circuit 43 and the error amplifier module 47 are as shown in FIG. 19 or FIG. 20. The second summing circuit 55 and the fast amplifier module 59 are as shown in FIG. 5.

A fourteenth embodiment, shown in plan view in FIG. 23, is similar to the thirteenth embodiment, but the chopper driver module 25 and the series chopper module 37 are as shown in FIG. 11, with the transistor 183 and the connection of the signal line 28 to this transistor being deleted.

In a fifteenth embodiment, shown in plan view in FIG. 24, the series chopper module 33 is deleted, and the shunt chopper module 21 and diplexer module 23 are as shown in FIG. 22. The chopper driver module 25 is as shown in FIG. 13, with the signals lines 28 and 30 and the series chopper module 33, the FET 157, and the resistors 159 and 161 being deleted. The signal line 35 and 29 are identified with one another. The slow amplifier module 40, summing circuit 43 and error amplifier module 47 are as shown in FIG. 19 or FIG. 20. The second summing circuit 55 and the fast amplifier module 59 are as shown in FIG. 5.

The sixteenth embodiment is similar to the fifteenth embodiment, with the BJT 120 in FIG. 22 being replaced by an FET. The chopper driver module 25 is as shown in FIG. 16, with the signal line 28 and the series chopper module 33 being deleted. The signal lines 35 and 29 are identified with one another.

FIG. 25 illustrates an environment in which the invention 11 may be used. An envelope detector 281 includes an input terminal 283 that receives an undulatory voltage input signal $v_{in}$. This input signal is passed through a capacitor 285, used to suppress dc input signals, to the cathode of a first diode 289, through a resistor 291 and through a capacitor 293 to ground. The signal $v'_{in}$ that appears at the cathode of the diode 289 is also grounded through a resistor 287. The current signal that appears between the resistor 291 and the capacitor 293, denoted $I_{in,1}$, is also passed by a signal line 295 to the first input terminal 13 of the invention. The input signal $v'_{in}$ also appears at the anode of a second diode 297 whose cathode is connected through a resistor 299 and a capacitor 301 to ground. The current signal, denoted $I_{in,2}$, that appears between the resistor 299 and the capacitor 301 is passed by a signal line 303 to the second input terminal 15 of the invention.

In the single input line embodiments nos. 9–16 that have no input terminal 15, the envelope detector 281 shown in FIG. 25 may be simplified by omitting the diode 297, the resistor 299, the capacitor 301 and the signal line 303.

FIG. 26 graphically illustrates a representative oscillating voltage signal $v_{in}$ that appears at the input terminal 283 and the corresponding positive and negative envelopes defined by $I_{in,1}$ and $I_{in,2}$. The negative envelope 313 (lower dotted line) appears as the signal $I_{in,1}$ on the signal line 295, and the positive envelope 315 (upper dotted line) appears as the signal $I_{in,2}$ on the signal line 303. Thus, if the input signal $v_{in}$ is approximately symmetric about zero voltage and does not vary too rapidly in time, the negative and positive detector envelopes will be approximately mirror images of one another. In a preferred embodiment in FIG. 18, the capacitors 285, 293 and 301 each have capacitance values of 30 picofarads, the resistors 291 and 299 each have resistance values of 100 Ohms, and the resistance value of the resistor 287 is chosen so that the input impedance of the peak detector device 281 appears to be about 50 Ohms for the input frequencies of interest.

The two input signals presented at the input terminals 13 and 15 in FIG. 1 are of opposite polarity and will usually have approximately the same magnitude. These two input signals might be represented by time varying functions $-s(t)+cm(t)$ and $s(t)+cm(t)$, where cm(t) is a common mode signal that is greatly attenuated by the action of the instrumentation amplifier in the balanced embodiments (two input lines); and s(t) is the desired signal free of any common mode interference.

Although particular types of transistors, BJT or FET, have been shown and discussed in the embodiments illustrated in FIGS. 1–23, considerable flexibility exists here and BJTs and FETs may be used interchangeably in many places. For example, the BJT 121 used in the shunt chopper module 23 in FIG. 2 may be replaced by a fast acting FET such as a J105 that has a very low on-resistance. In a similar manner, any or all of the BJTs 145, 153 and 175 in FIG. 3 may be replaced by suitable FETs; and any or all of the FETs 157, 167, 181 and 183 shown in FIG. 3 may be replaced by suitable BJTs such as MMBT 3904. The BJT 233 shown in FIG. 4 may be replaced by an FET such as the MMBF 4393. Analogous replacements may be made in FIGS. 8, 11, 13 and 19. The word "transistor", when used herein without adjectives such as BJT or FET, refers to a BJT or an FET that has a control terminal (base for the BJT and gate for the FET) and has first and second terminals through which most of the current flows. These first and second terminals may be the emitter and collector terminals for the BJT and may be the source and drain terminals for the FET.

Each npn BJT that has a positive (or ground) voltage source connected to the collector and has a ground (or negative) voltage source connected to the emitter may be replaced by a pnp BJT that has a negative (or ground) voltage source connected to the collector and has a ground (or positive) voltage source connected to the emitter, and conversely, in FIGS. 2, 3, 4, 5, 8, 11, 13, 16, 19, 20 and 22.

The invention disclosed herein splits an incoming signal, or each of two incoming signals of opposite polarities, into a high frequency component signal and a low frequency component signal and amplifies each of these component signals in separate circuits that may be separately optimized for different ranges of frequency. The amplified low and high frequency component signals are then combined, after suitable processing thereof to promote consistency, to form a single output signal. Signal chopping may be provided to allow periodic resetting of the zero levels of the one or two input signals.

We claim:

1. Amplifier apparatus comprising:
   diplexer means for receiving an input signal, for producing a low frequency component signal from the input signal and issuing this signal as a first diplexer output signal, and for producing a high frequency component signal from the input signal and issuing this signal as a second diplexer output signal;
   low frequency amplification means for receiving as an input signal the first diplexer output signal, for amplifying this input signal to produce a first amplified signal, for forming the sum of this signal and a composite output signal, and for amplifying this sum signal to produce and issue a low frequency output signal; and
   high frequency amplification means for receiving as input signals the second diplexer output signal and the low frequency output signal, for forming and amplifying the sum of these two input signals to produce and issue the composite output signal.

2. The apparatus of claim 1, further comprising:
   chopper driver means for receiving a chop command signal intermittently and for producing and issuing an active chopper driver output signal only when the chop command signal is being received;
   wherein said diplexer means receives the chopper driver signal and causes said first diplexer output signal to be approximately equal to zero when the active chopper driver signal is being received.

3. The apparatus of claim 2, wherein said diplexer means includes a field effect transistor having a first terminal connected to receive said diplexer input signal, and having a control terminal connected to receive said active chopper driver signal, where the on-state resistance of the transistor is no more than five ohms.

4. The apparatus of claim 3, wherein said chopper driver means comprises:
   a first transistor having a control terminal that receives said chop command signal through a first resistor, having a first terminal that is grounded, and having a second terminal that is connected to a negative voltage source through a second resistor and that issues said second active chopper driver signal;
   a second transistor having a control terminal that is connected to the second terminal of the first transistor through a third resistor, having a first terminal that is connected to a negative voltage source, and having a second terminal that is connected to a positive voltage source through a fourth resistor; and
   a diode having a cathode that is connected to the second terminal of the second transistor and having an anode that is grounded through a fifth resistor and is connected to said control terminal of said field effect transistor in said diplexer means.

5. The apparatus of claim 4, wherein a first end of said first resistor is connected to a positive voltage source through a sixth resistor and a second end of said first resistor is connected to a negative voltage source through a seventh resistor.

6. The apparatus of claim 2, further comprising:
   chopper means for receiving said first diplexer output signals, for receiving a second active chopper driver signal, for issuing said first diplexer output signal as said input signal for said low frequency amplification means when the second active chopper driver signal is not being received, and for issuing, as said input signal for said low frequency amplification means, a signal that is approximately zero when said second active chopper driver signal is being received;
   wherein said chopper driver means further produces and issues a second active chopper driver output signal only when the chop command signal is being received.

7. The apparatus of claim 6, wherein said diplexer means includes a bipolar junction transistor having a collector terminal connected to receive said first duplexer input signal, having an emitter terminal that is grounded, and having a control terminal connected to receive said active chopper driver signal, where the on-state resistance of the transistor is no more than five ohms.

8. The apparatus of claim 7 wherein said chopper driver means comprises:
   a first transistor having a control terminal that receives said chop command signal through a first resistor, having a first terminal that is grounded, and having a second terminal that is connected to a negative voltage source through a second resistor;
   a second transistor having a control terminal that is connected to the second terminal of the first transistor through a third resistor, having a first terminal that is connected to a positive voltage source through a fourth resistor, and having a second terminal that is connected to a negative voltage source;
   a diode having a cathode that is connected to the first terminal of the second transistor;
   a third transistor having a control terminal that is connected to the anode of the diode, having a first terminal that is connected to the control terminal thereof through a fifth resistor and is connected to a negative voltage source through a sixth resistor, and having a second terminal that is connected to said control terminal of said bipolar junction transistor in said diplexer means; and
   a fourth transistor having a control terminal that is connected through a seventh resistor to the first terminal of the third transistor and having a first terminal that is grounded.

9. The apparatus of claim 8, wherein a first end of said first resistor is connected to a positive voltage source through an eighth resistor and a second end of said first resistor is connected to a negative voltage source through a ninth resistor.

10. The apparatus of claim 6, wherein said diplexer means includes a field effect transistor having a first terminal connected to receive said first diplexer input signal, and having a control terminal connected to receive said active chopper driver signal, where the on-state resistance of the transistor is no more than five ohms.

11. The apparatus of claim 10, wherein said chopper driver means comprises:
a first transistor having a control terminal that receives said chop command signal through a first resistor, having a first terminal that is grounded, and having a second terminal that is connected to a negative voltage source through a second resistor and that issues said second active chopper driver signal;
a second transistor having a control terminal that is connected to the second terminal of the first transistor through a third resistor, having a first terminal that is connected to a negative voltage source, and having a second terminal that is connected to a positive voltage source through a fourth resistor; and
a diode having a cathode that is connected to the second terminal of the second transistor and having an anode that is grounded through a fifth resistor and is connected to said control terminal of said field effect transistor in said diplexer means.

12. The apparatus of claim 11, wherein a first end of said first resistor is connected to a positive voltage source through a sixth resistor and a second end of said first resistor is connected to a negative voltage source through a seventh resistor.

13. The apparatus of claim 6, wherein said diplexer means includes a p-i-n diode.

14. The apparatus of claim 13, wherein said chopper driver means comprises:
a first transistor having a control terminal that receives said chop command signal through a first resistor, having a first terminal that is grounded, and having a second terminal that is connected to a negative voltage source through a second resistor;
a second transistor having a control terminal that is connected to the second terminal of the first transistor through a third resistor, having a first terminal that is connected to a positive voltage source through a fourth resistor, and having a second terminal that is connected to a negative voltage source;
a diode having a cathode that is connected to the first terminal of the second transistor; and
a third transistor having a control terminal that is connected to the anode of the diode, having a first terminal that is connected to the control terminal thereof through a fifth resistor and is connected to a negative voltage source, and having a second terminal that is connected to chopper means.

15. The apparatus of claim 14, wherein a first end of said first resistor is connected to a positive voltage source through a sixth resistor and a second end of said first resistor is connected to a negative voltage source through a seventh resistor.

16. The apparatus of claim 1, said diplexer means includes a bipolar junction transistor having a collector terminal connected to receive said diplexer input signal, having an emitter terminal that is grounded, and having a control terminal connected to receive said active chopper driver signal, where the on-state resistance of the is no more than five ohms.

17. The apparatus of claim 16, wherein said chopper driver means comprises:
a first transistor having a control terminal that receives said chop command through a first resistor, having a first terminal is grounded, and having a second terminal that is connected to a negative voltage source through a second resistor;
a second transistor control terminal that is connected to the second to of the first transistor through a third resistor, having a first terminal that is connected to a positive voltage source through a fourth resistor, and having a second terminal that is connected to a negative voltage source;
a diode having a cathode that is connected to the first terminal of the second transistor;
a third transistor h a control terminal that is connected to the anode of the diode, having a first terminal that is connected the control terminal thereof through a fifth resistor is connected to a negative voltage source through a sixth resistor, and having a second terminal that is connected to said control terminal of said bipol junction transistor in said diplexer means; and
a fourth transistor having a control terminal that is connected through a seventh resistor to the first terminal of the third transistor and having a first terminal that is grounded.

18. The apparatus of claim 17, wherein a first end of said first resistor is connected to a positive voltage source through a eighth resistor and a second end of said first resistor is connected to a negative voltage source through a seventh resistor.

19. The apparatus of claim 1, further comprising:
chopper driver means for receiving a chop command signal intermittently and for producing and issuing an active chopper driver output signal only when the chop command signal is being received; and
chopper means for receiving said first diplexer output signal, for receiving the active chopper driver output signal, for issuing said first diplexer output signals as said input signal for said low frequency amplification means when the active chopper driver signal is not being received, and for issuing, as said first input signal for said low frequency amplification means, a signal that is approximately zero when the active chopper driver signal is being received.

20. The apparatus of claim 19, wherein said chopper driver means comprises:
a transistor having a control terminal that receives said chop command signal through a first resistor, having a first terminal that is grounded, and having a second terminal that is connected to a negative voltage source through a second resistor and that issues said active chopper driver signal thereat only when said chop command signal is received.

21. The apparatus of claim 19, wherein said chopper driver means comprises:
a first transistor having a control terminal that receives said chop command signal through a first resistor, having a first terminal that is grounded, and having a second terminal that is connected to a negative voltage source through a second resistor;
a second transistor having a control terminal that is connected to the second terminal of the first transistor through a third resistor, having a first terminal that is connected to a positive voltage source through a fourth resistor, and having a second terminal that is connected to a negative voltage source;
a diode having a cathode that is connected to the first terminal of the second transistor; and a third transistor having a control terminal that is connected to the anode of the diode, having a first terminal that is connected to the control terminal thereof through a fifth resistor and is connected to a negative voltage source, and having a second terminal that is connected to a signal line that carries said first diplexer output signal.

22. The apparatus of claim 21, wherein a first end of said first resistor is connected to a positive voltage source through a sixth resistor and a second end of said first resistor is connected to a negative voltage source through a seventh resistor.

23. The apparatus of claim 1, wherein said low frequency amplification means comprises:
a first feedback differential amplifier circuit having the positive input terminal grounded, with the negative input terminal receiving said low frequency amplification means input signal, and with the output terminal issuing a first amplifier output signal that is an amplification of the input signal;
a second feedback differential amplifier circuit having the positive input terminal grounded, with the negative input terminal receiving the first amplifier output signal, and with the output terminal issuing a second amplifier output signal that is an amplification of the input signal;
phase lead circuit means for receiving the second amplifier output signal as an input signal and for producing and issuing a phase lead circuit means output signal with an electrical phase that leads the electrical phase of the input signal by approximately a predetermined amount;
a third feedback differential amplified circuit having the positive input terminal grounded, with the negative input terminal receiving the sum of the phase lead circuit means output signal and said composite output signal, and with the output terminal issuing as said low frequency output signal an amplification of the signal received at the input terminal of the third amplifier circuit.

24. The apparatus of claim 1, wherein said low frequency amplification means comprises:
a first feedback differential amplified circuit having the negative input terminal grounded through a first resistor, with the positive input terminal receiving said low frequency amplification means input signal, and with the output terminal issuing a first amplifier output signal that is an amplification of the input signal;
phase lead circuit means for receiving the first amplifier output signal as an input signal and for producing and issuing a phase lead circuit means output signal with an electrical phase that leads the electrical phase of the input signal by approximately a predetermined amount;
a second feedback differential amplifier circuit having the positive input terminal grounded, with the negative input terminal receiving the sum of the phase lead circuit means output signal and said composite output signal, and with the output terminal issuing as said low frequency output signal an amplification of the signal received at the input terminal of the third amplifier circuit.

25. The apparatus of claim 1, wherein said high frequency amplification means comprises:
a bipolar junction transistor whose base terminal receives the sum of said second diplexer output signal and said low frequency output signal, whose emitter terminal is connected to a positive voltage source, whose collector terminal is connected to a negative voltage source through a first resistor and is connected to the base terminal through a second resistor and a capacitor connected in series, where said composite output signal appears at the collector terminal.

26. The apparatus of claim 25, wherein said base terminal of said bipolar junction transistor is connected to a positive voltage source through a third resistor.

27. Amplifier apparatus comprising:
diplexer means for receiving first and second input signals of opposite polarity and approximately the same magnitude, for producing first and second low frequency component signals from the first and second input signals, respectively, and issuing these signals as first and second diplexer output signals, and for producing a high frequency component signal from the first input signals and issuing this signal as a third diplexer output signal;
low frequency amplification means for receiving as first and second input signals the first and second diplexer output signals, for amplifying the difference of the first and second input signals to produce a first difference signal, for forming a second difference between the first difference signal and a composite output signal, and for amplifying the second difference signal to produce and issue a low frequency output signal; and
high frequency amplification means for receiving as input signals the third diplexer output signal and the low frequency output signal, for forming and amplifying the sum of these two input signals to produce and issue the composite output signal.

28. The apparatus of claim 27, wherein:
said diplexer means produces a second high frequency component signal from said second input signal to said diplexer means and issues the second high frequency component signal as a fourth diplexer output signal; and
said low frequency amplification means receives the fourth diplexer output signal and forms a third difference between said second difference signal and the fourth diplexer signal, amplifies this third difference signal to produce and issue said low frequency output signal.

29. The apparatus of claim 27, further comprising:
chopper driver means for receiving a chop command signal intermittently and for producing and issuing an active chopper driver output signal only when the chop command signal is being received, wherein said diplexer means receives the chopper driver signal, causes said first and said second diplexer output signals to be approximately equal when the active chopper driver signal is being received, and allows said first and second diplexer output signals to be independent of one another when the active chopper driver signal is not being received.

30. The apparatus of claim 29, wherein said diplexer means comprises a bipolar junction transistor having a collector terminal connected to receive said first diplexer input signal, having an emitter terminal connected to receive said second diplexer input signal, and having a control terminal connected to receive said active chopper driver signal, where the on-state resistance of the transistor is no more than five ohms.

31. The apparatus of claim 30, wherein said chopper driver means comprises:
- a first transistor having a control terminal that receives said chop command signal through a first resistor, having a first terminal that is grounded, and having a second terminal that is connected to a negative voltage source through a second resistor;
- a second transistor having a control terminal that is connected to the second terminal of the first transistor through a third resistor, having a first terminal that is connected to a positive voltage source through a fourth resistor, and having a second terminal that is connected to a negative voltage source;
- a diode having a cathode that is connected to the first terminal of the second transistor;
- a third transistor having a control terminal that is connected to the anode of the diode, having a first terminal that is connected to the control terminal thereof through a fifth resistor and is connected to a negative voltage source through a sixth resistor, and having a second terminal that is connected to said control terminal of said bipolar junction transistor in said diplexer means;
- a fourth transistor having a control terminal that is connected through a seventh resistor to the first terminal of the third transistor and having a first terminal that is grounded;
- a fifth transistor having a control terminal that is connected to the first terminal of the second transistor, having a first terminal that is connected to a signal line that carries said second diplexer output signal, and having a second terminal that is connected to a positive voltage source.

32. The apparatus of claim 31, wherein a first end of said first resistor is connected to a positive voltage source through an eighth resistor and a second end of said first resistor is connected to a negative voltage source through a ninth resistor.

33. The apparatus of claim 29, wherein said diplexer means comprises a field effect transistor having a first terminal connected to receive said first diplexer input signal, having a second terminal connected to receive said second diplexer input signal, and having a control terminal connected to receive said active chopper driver signal, where the on-state resistance of the transistor is no more than five ohms.

34. The apparatus of claim 33, wherein said chopper driver means comprises:
- a first transistor having a control terminal that receives said chop command signal through a first resistor, having a first terminal that is grounded, and having a second terminal that is connected to a negative voltage source through a second resistor;
- a second transistor having a control terminal that is connected to the second terminal of the first transistor through a third resistor, having a first terminal that is connected to a negative voltage source, and having a second terminal that is connected to a positive voltage source through a fourth resistor; and
- a diode having a cathode that is connected to the second terminal of the second transistor and having an anode that is grounded through a fifth resistor and is connected to said control terminal of said field effect transistor in said diplexer means.

35. The apparatus of claim 34, wherein a first end of said first resistor is connected to a positive voltage source through a sixth resistor and a second end of said first resistor is connected to a negative voltage source through a seventh resistor.

36. The apparatus of claim 29, further comprising:
- chopper means for receiving said first and said second diplexer output signals, for receiving a second active chopper driver signal, for issuing said first and said second diplexer output signals as said first and said second input signals for said low frequency amplification means when the second active chopper driver signal is not being received, and for issuing, as said first and said second input signals for said low frequency amplification means, two signals that are approximately zero when said second active chopper driver signal is being received;
- wherein said chopper driver means further produces and issues a second active chopper driver output signal only when the chop command signal is being received.

37. The apparatus of claim 36, wherein said diplexer means comprises a bipolar junction transistor having a collector terminal connected to receive said first diplexer input signal, having an emitter terminal connected to receive said second diplexer input signal, and having a control terminal connected to receive said active chopper driver signal, where the on-state resistance of the transistor is no more than five ohms.

38. The apparatus of claim 37, wherein said chopper driver means comprises:
- a first transistor having a control terminal that receives said chop command signal through a first resistor, having a first terminal that is grounded, and having a second terminal that is connected to a negative voltage source through a second resistor;
- a second transistor having a control terminal that is connected to the second terminal of the first transistor through a third resistor, having a first terminal that is connected to a positive voltage source through a fourth resistor, and having a second terminal that is connected to a negative voltage source;
- a diode having a cathode that is connected to the first terminal of the second transistor;
- a third transistor having a control terminal that is connected to the anode of the diode, having a first terminal that is connected to the control terminal thereof through a fifth resistor and is connected to a negative voltage source through a sixth resistor and having a second terminal that is connected to said control terminal of said bipolar junction transistor in said diplexer means;
- a fourth transistor having a control terminal that is connected through a seventh resistor to the first terminal of the third transistor and having a first terminal that is grounded;
- a fifth transistor having a control terminal that is connected to the first terminal of the second transistor, having a first terminal that is connected to a signal line that carries said second diplexer output signal, and having a second terminal that is connected to a positive voltage source.

39. The apparatus of claim 38, wherein a first end of said first resistor is connected to a positive voltage source through an eighth resistor and a second end of said first resistor is connected to a negative voltage source through a ninth resistor.

40. The apparatus of claim 36, wherein said diplexer means comprises a field effect transistor having a first terminal connected to receive said first diplexer input signal, having a second terminal connected to receive said second diplexer input signal, and having a control terminal connected to receive said active chopper driver signal, where the on-state resistance of the transistor is no more than five ohms.

41. The apparatus of claim 40, wherein said chopper driver means comprises:
- a first transistor having a control terminal that receives said chop command signal through a first resistor, having a first terminal that is grounded, and having a second terminal that is connected to a negative voltage source through a second resistor and that issues said second chopper driver signal;
- a second transistor having a control terminal that is connected to the second terminal of the first transistor through a third resistor, having a first terminal that is connected to a negative voltage source, and having a second terminal that is connected to a positive voltage source through a fourth resistor; and
- a diode having a cathode that is connected to the second terminal of the second transistor and having an anode that is grounded through a fifth resistor and is connected to said control terminal of said field effect transistor in said diplexer means.

42. The apparatus of claim 41, wherein a first end of said first resistor is connected to a positive voltage source through a sixth resistor and a second end of said first resistor is connected to a negative voltage source through a seventh resistor.

43. The apparatus of claim 36, wherein said diplexer means comprises a p-i-n diode having an anode and a cathode to receive said first and said second diplexer input signals.

44. The apparatus of claim 43, wherein said chopper driver means comprises:
- a first transistor having a control terminal that receives said chop command signal through a first resistor, having a first terminal that is grounded, and having a second terminal that is connected to a negative voltage source through a second resistor;
- a second transistor having a control terminal that is connected to the second terminal of the first transistor through a third resistor, having a first terminal that is connected to a positive voltage source through a fourth resistor, and having a second terminal that is connected to a negative voltage source;
- a diode having a cathode that is connected to the first terminal of the second transistor;
- a third transistor having a control terminal that is connected to the anode of the diode, having a first terminal that is connected to the control terminal thereof through a fifth resistor and is connected to a negative voltage source through a sixth resistor, and having a second terminal that is connected to a signal line that carries said first diplexer output signal;
- a fourth transistor having a control terminal that is connected through a seventh resistor to the first terminal of the third transistor and having a first terminal that is grounded;
- a fifth transistor having a control terminal that is connected to the first terminal of the second transistor, having a first terminal that issues said second diplexer output signal, and having a second terminal that is connected to a negative voltage source.

45. The apparatus of claim 44, wherein a first end of said first resistor is connected to a positive voltage source through an eighth resistor and a second end of said first resistor is connected to a negative voltage source through a ninth resistor.

46. The apparatus of claim 27, further comprising:
- chopper driver means for receiving a chop command signal intermittently and for producing and issuing an active chopper driver output signal only when the chop command signal is being received; and
- chopper means for receiving said first and said second diplexer output signals, for receiving the active chopper driver output signal, for issuing said first and said second diplexer output signals as said first and said second input signals for said low frequency amplification means when the active chopper driver signal is not being received, and for issuing, as said first and said second input signals for said low frequency amplification means, two signals that are approximately zero when the active chopper driver signal is being received.

47. The apparatus of claim 46, wherein said chopper driver means comprises:
- a transistor having a control terminal that receives said chop command signal through a first resistor, having a first terminal that is grounded, and having a second terminal that is connected to a negative voltage source through a second resistor and that issues said active chopper driver signal thereat only when said chop command signal is received.

48. The apparatus of claim 46, wherein said chopper driver means comprises:
- a first transistor having a control terminal that receives said chop command signal through a first resistor, having a first terminal that is grounded, and having a second terminal that is connected to a negative voltage source through a second resistor;
- a second transistor having a control terminal that is connected to the second terminal of the first transistor through a third resistor, having a first terminal that is connected to a positive voltage source through a fourth resistor, and having a second terminal that is connected to a negative voltage source;
- a diode having a cathode that is connected to the first terminal of the second transistor;
- a third transistor having a control terminal that is connected to the anode of the diode, having a first terminal that is connected to the control terminal thereof through a fifth resistor and is connected to a negative voltage source, and having a second terminal that is connected to a signal line that carries said first diplexer output signal; and
- a fourth transistor having a control terminal that is connected to the first terminal of the second transistor, having a first terminal that is connected to a signal line that carries said second diplexer output signal, and having a second terminal that is connected to a positive voltage source.

49. The apparatus of claim 48, wherein a first end of said first resistor is connected to a positive voltage source through a sixth resistor and a second end of said first resistor is connected to a negative voltage source through a seventh resistor.

50. The apparatus of claim 27, wherein said low frequency amplification means comprises:
- first and second feedback differential amplifier circuits with positive input terminals grounded and with the negative input terminals receiving said first and said second input signals, respectively, for said low frequency amplification means, that produces and issues first and second amplifier output signals, respectively;

a third feedback differential amplifier circuit having its positive input terminal grounded through a first resistor, to receive the first and second amplifier output signals at its negative and positive input terminals, respectively, and to form and amplify the difference of these two signals as a third amplifier output signal;

phase lead circuit means for receiving the third amplifier output signal as an input signal and for producing and issuing a phase lead circuit output signal with an electrical phase that leads the electrical phase of the input signal by approximately a predetermined amount; and a fourth feedback differential amplifier circuit having its positive input terminal grounded through a second resistor, to receive the phase lead circuit means output signal and said composite output signal at the negative input terminal thereof, and amplify and issue this signal as said low frequency output signal.

51. The apparatus of claim 27, wherein said high frequency amplification means comprises:

a bipolar junction transistor whose base terminal receives the sum of said third diplexer output signal and said low frequency output signal, whose emitter terminal is connected to a positive voltage source, whose collector terminal is connected to a negative voltage source through a first resistor and is connected to the base terminal through a second resistor and a capacitor connected in series, where said composite output signal appears at the collector terminal.

52. The apparatus of claim 51, wherein said base terminal of said bipolar junction transistor is connected to a positive voltage source through a third resistor.

* * * * *